United States Patent
Ziarani

(10) Patent No.: US 7,003,413 B2
(45) Date of Patent: Feb. 21, 2006

(54) SYSTEM AND METHOD OF EXTRACTION OF NONSTATIONARY SINUSOIDS

(75) Inventor: Alireza K. Ziarani, Hannawa Falls, NY (US)

(73) Assignee: Bio-Logic Systems Corp., Mundelein, IL (US)

(*) Notice: Subject to any disclaimer, the term of this patent is extended or adjusted under 35 U.S.C. 154(b) by 50 days.

(21) Appl. No.: 10/698,801

(22) Filed: Oct. 31, 2003

(65) Prior Publication Data

US 2004/0133371 A1    Jul. 8, 2004

Related U.S. Application Data

(63) Continuation-in-part of application No. PCT/CA02/00696, filed on Oct. 5, 2002.

(30) Foreign Application Priority Data

May 28, 2001   (CA) ................................ 2349041

(51) Int. Cl.
    *G06F 19/00*   (2006.01)
(52) U.S. Cl. .................. 702/70; 600/559; 381/312; 324/76.44; 702/75
(58) Field of Classification Search .............. 702/70, 702/73, 74, 75, 76, 77, 189, 190, 191, 195, 702/197; 600/559; 381/312, 317, 318, 71.1, 381/98, 94.1, 104; 324/76.47
    See application file for complete search history.

(56) References Cited

U.S. PATENT DOCUMENTS

| | | | |
|---|---|---|---|
| 4,197,524 A | | 4/1980 | Salem |
| 5,165,051 A | * | 11/1992 | Kumar .................... 324/76.47 |
| 5,355,083 A | * | 10/1994 | George et al. .............. 324/229 |
| 5,541,510 A | * | 7/1996 | Danielson ................... 324/233 |
| 5,583,784 A | * | 12/1996 | Kapust et al. ................ 702/77 |
| 5,583,785 A | * | 12/1996 | Hainey ........................ 702/79 |
| 5,696,578 A | * | 12/1997 | Ishida et al. ............... 356/28.5 |
| 5,721,689 A | * | 2/1998 | Hart et al. .................... 702/75 |
| 5,734,577 A | * | 3/1998 | Chesir et al. ............... 342/159 |
| 6,006,083 A | * | 12/1999 | Tong et al. ................. 455/401 |
| 6,088,403 A | * | 7/2000 | Johnson ...................... 375/340 |
| 6,122,652 A | * | 9/2000 | Jin et al. .................... 708/312 |
| 6,175,818 B1 | * | 1/2001 | King .......................... 704/232 |
| 6,463,411 B1 | * | 10/2002 | Li et al. ..................... 704/226 |

(Continued)

FOREIGN PATENT DOCUMENTS

CA    2 300 021 A1    9/2000

(Continued)

OTHER PUBLICATIONS

Nishiyama, "A Nonlinear Filter for Estimating a Sinusoidal Signal and Its Parameters in White Noise: On the Case of a Single Sinusoid", IEEE, 1997.*

(Continued)

Primary Examiner—Patrick J. Assouad
(74) Attorney, Agent, or Firm—Marshall, Gerstein & Borun LLP

(57) ABSTRACT

Signal processing techniques and systems and, in particular, an apparatus, system, algorithm and method of extraction of sinusoidal signals of time-varying nature is described. The apparatus, system, algorithm and method provide for extraction of a specified single sinusoidal component of an input signal, potentially containing other components and noise, and tracking variations of the amplitude, phase and frequency of such a sinusoid component over time. A "tool" or "core unit," embodying the apparatus, system, algorithm or method may be used in isolation or as the fundamental building block of single-core or multi-core systems.

40 Claims, 17 Drawing Sheets

U.S. PATENT DOCUMENTS

| | | | |
|---|---|---|---|
| 6,577,968 B1 * | 6/2003 | Nelson | 702/77 |
| 6,602,202 B1 | 8/2003 | John et al. | |
| 6,687,630 B1 * | 2/2004 | Dionne | 702/76 |
| 6,778,955 B1 * | 8/2004 | Li et al. | 704/226 |
| 6,820,017 B1 * | 11/2004 | Jurisch et al. | 702/60 |

FOREIGN PATENT DOCUMENTS

| | | |
|---|---|---|
| CA | 2 346 243 A1 | 11/2002 |
| CA | 2 349 041 A1 | 11/2002 |
| CA | 2 359 445 A1 | 4/2003 |
| CA | 2 385 343 A1 | 11/2003 |
| EP | 0 803 623 A1 | 10/1997 |
| WO | WO 9 839 539 A1 | 9/1998 |
| WO | WO 0 159 238 A2 | 8/2001 |
| WO | WO 02/097656 A2 | 12/2002 |

OTHER PUBLICATIONS

Karimi-Ghartemani, et al. "Stability of a Nonlinear Adaptive System for Filtering and Parameter Estimation" *2002 MTNS Problem Book Open Problems on the Mathematical Theory of Systems*, pp. 53-55, Aug. 12-16, 2002.

Karimi-Ghartemani, et al. "Periodic Orbit Analysis of Two Dynamical Systems for Electrical Engineering Applications" *Journal of Engineering Mathematics* 45: 135-154, 2003.

Karimi-Ghartemani, et al. "Performance Characterization of a Non-linear System as Both an Adaptive Notch Filter and a Phase-locked Loop" *International Journal of Adaptive Control and Signal Processing* 18 :23-53, Jan. 5, 2004.

Ziariani, et al. "SNR Improvement of Emat Signals Using Adaptive Filtering" *10th International Symposium on Electromagnetic Fields in Electrical Engineering*, Cracow, Poland, Sep. 20-22, 2001.

Ziariani, et al. "Preliminary Results on Interface Elimination from Lightning Recordings," *International Workshop on Electromagnetic Radiation from Lightning to Tall Structures*, pp. 1-2, 2001.

Ziariani, et al. "A Method of Elimination of Interferences of Quasi-periodic Nature," *MWSCAS-2001* vol. 1 of 2, pp. 363-366.

Ziariani, et al. "Galerkin's Method and the Variational Procedure," *IEEE Transactions on Magnetics*, vol. 38, No. 1, pp. 190-199, Jan., 2002.

Ziariani, et al. "A Nonlinear Adaptive Method of Elimination of Power Line Interference in ECG Signals", *IEEE Transactions on Biomedical Engineering*, vol. 49, No. 6, pp. 540-547, Jun., 2002.

Ziariani, et al. "Adaptive Signal Quality Enhancement of Emat Signals," *Electromagnetic Fields in Electrical Engineering*, IOS Press, pp 543-548, 2002.

Ziariani, et al. "A Nonlinear Method of Frequency Estimation in Noise," *MWSCAS-2002* vol. III of III, pp. I-316-I-319.

Ziariani, et al. "Experimental Verification of a Novel Method of Extraction of Nonstationary Sinusoids," *MWSCAS-2002* vol. I of III, pp. I-455-1458.

Ziariani, et al. "A Novel Time-Domain Method of Analysis of Pulsed Sine Wave Signal," *IEEE Transactions on Instrumentation and Measurement*, vol. 52, No. 3, pp. 809-814, Jun., 2003.

Ziariani, et al. "A Novel Method of Estimation of DPOAE Signals," *IEEE Transactions on Biomedical Engineering*, Vo. 51, No. 5, pp. 864-868, May, 2004.

Ziariani, et al. "An Adaptive Noise Reduction Technique," *IEEE 2001*, pp. 251-254.

Karimi-Ghartemani et al. "A Nonlinear Time-Frequency Analysis Method," *IEEE Transactions on Signal Processing*, vol. 52, No. 6, Jun. 2004.

International Search Report, PCT/CA02/00069, Apr. 9, 2002.

* cited by examiner

SYSTEM AND METHOD OF EXTRACTION OF NONSTATIONARY SINUSOIDS

CROSS-REFERENCE TO RELATED APPLICATIONS

This patent is a continuation-in-part of International Application PCT/CA02/00696 filed Oct. 5, 2002 designating the United States.

TECHNICAL FIELD

This patent relates to signal processing techniques and systems and, in particular, to a method of extraction of sinusoidal signals of time-varying nature and an apparatus built on the basis of such a method.

BACKGROUND

The effect of periodic phenomena, registered as signals, is usually studied using common signal analysis tools such as Fourier analysis. A given signal, as long as it manifests some periodicity, can be thought of as being composed of a series of single sinusoidal components or, more commonly named, tones. Frequency domain characterization of signals amounts to the identification of individual constituting components of a given signal and their corresponding values of amplitude and phase. In the case of nonstationary signals, all characteristics of the constituting components, including frequency, may vary over time. The main shortcoming of Fourier-based methods is their inherent fixed-frequency assumption which limits their applicability to the majority of real signals, the frequency characteristics of which may vary with time. There have been numerous attempts to devise adaptation mechanisms to be incorporated into signal analysis tools to render them useful for analysis of quasi-periodic signals. Linear adaptive filtering is an example of such methods reported so far with its success and shortcomings.

Aside from the time-varying quality of real signals, very often signals are buried under noise and disturbances and may thus be severely distorted. Often, a useful signal analysis tool loses its efficiency when it is applied to signals affected by noise and disturbances. Thus, it is often necessary to recover the signal itself out of the background noise, especially under nonstationary conditions. Extraction of the signal itself, and not just its characteristics, is of particular interest in applications where synchronization matters; i.e. where the total phase information of a signal is important. In such cases, a single sinusoidal component of a given signal, or the totality of a number of such sinusoids, is to be extracted, or equivalently a desirable noise-free synchronized signal is to be synthesized. Synthesization of signals synchronous with a given reference signal finds applications in more areas than those dealing with extraction of signals out of noise and may very well include those applications in which phase-locked loop (PLL) circuits and systems are employed.

Considering the inadequacy of the performance of the available standard signal analysis tools, such as Fourier-based techniques, adaptive filters and PLLs, in extracting sinusoids of time-varying nature buried under noise in a unified way, it is not difficult to explain the existing diversity of the methods, each designed to tackle a specific type of problem.

Signal processing techniques and systems, and in particular methods of extraction of a desired signal within a noisy environment find significant application in audiometry, i.e., the measuring of how well someone can hear. Thus improvements in techniques, systems and methods for the extraction of a signal from a noisy environment can lead to improvements in audiometry.

Conventional audiometry is performed by having a subject respond to acoustic stimuli by pressing a button, saying "yes", or repeating words that may be presented in the stimulus. These tests are subjective in nature. Audiometry allows an audiologist to determine the auditory threshold of the subject, which is defined as the lowest intensity at which a sound can be heard. The audiologist evaluates the auditory threshold of a subject by using a stimulus that most commonly consists of a pure tone. The stimulus is presented via earphones, headphones, free field speakers or bone conduction transducers. The results are presented as an audiogram which shows auditory thresholds for tones of different frequencies. The audiogram is helpful for diagnosing the type of hearing loss a subject may have. The audiogram can also be used to fit a hearing aid and adjust the level of amplification of the hearing aid for subjects who require hearing aids.

Conventional audiometry cannot be performed if the subject is an infant, young child or cognitively impaired adult. In these cases; objective tests of hearing are necessary in which the subject does not have to make a conscious response. Objective audiometry is essential for detecting hearing impairment in infants or elderly patients as well as for evaluating functional hearing losses. Furthermore, few objective tests have been developed for supra-threshold tests of speech, frequency, or intensity discrimination.

One form of objective audiometry uses auditory evoked potentials. Auditory evoked potential testing consists of presenting the subject with an acoustic stimulus and simultaneously or concurrently sensing (i.e. recording) potentials from the subject. The sensed potentials are the subject's electroencephalogram (EEG) which contain the subject's response to the stimulus if the subject's auditory system has processed the stimulus. These potentials are analyzed to determine whether they contain a response to the acoustic stimulus or not. Auditory evoked potentials have been used to determine auditory thresholds and hearing at specific frequencies.

One particular class of auditory evoked potentials is steady-state auditory evoked potentials (SSAEPs). The stimulus for the SSAEP consists of a carrier signal, which is usually a sinusoid, that is amplitude modulated by a modulation signal which is also usually a sinusoid. The SSAEP stimulus is presented to the subject while simultaneously recording the subject's EEG. If the auditory system of the subject responded to the SSAEP stimulus, then a corresponding steady-state sinusoidal signal should exist in the recorded EEG. The signal should have a frequency that is the same as the frequency of the modulation signal (i.e. modulation frequency). The presence of such a corresponding signal in the EEG is indicative of a response to the SSAEP stimulus. Alternatively, the phase of the carrier signal may be frequency modulated instead of or in addition to amplitude modulation to create the SSAEP stimulus. A system and method of SSAEP audiometry is described in U.S. Pat. No. 6,602,202, the disclosure of which is hereby expressly incorporated by reference.

However, objective audiometry employing SSAEP testing is time-consuming because the amplitude of the SSAEP response is quite small compared to the background noise, which is the subject's on going brain activity (i.e. EEG) while the test is being conducted. The SSAEP response thus has a small signal-to-noise ratio (SNR) which makes it difficult to detect the SSAEP response in a short time period. Thus, improvements in techniques, systems and methods of detecting the SSAEP response may lead to improvements in SSAEP audiometry.

Another form of objective audiometry is otoacoustic emission (OAE) audiometry. One form of OAE is distortion product otoacoustic emission audiometry (DPOAE). Distortion product otoacoustic emissions (DPOAEs) are very low level stimulated acoustic responses to two pure tones presented to the ear canal. DPOAE measurement provides an objective non-invasive measure of peripheral auditory function and is used for hearing assessment. DPOAE screening is becoming a standard clinical practice to predict potential sensorineural hearing loss especially in newborns.

DPOAEs have been recognized for a number years. But DPOAE measurement remains difficult because of the challenging nature of the signal processing task. In this type of otoacoustic test, two pure tones with frequencies $f_1$ and $f_2$ are presented to the cochlea. For best results, $f_2$ is usually chosen as $1.2f_1$. Due to the non-linearity of the ear, a very low level of distortion product of frequency $2f_1-f_2$ is generated in normal ears. The level of such DPOAE signal is a measure of functionality of the ear. Estimation of such a weak signal buried under two strong artifacts in a potentially noisy background is a challenging signal processing problem.

Conventionally, fast Fourier transform (FFT) is used as the main signal processing tool to estimate the level of DPOAE signals. Application of FFT in this problem has a number of shortcomings among which long measurement time is most pronounced. Such long measurement time is usually required for acquisition of more data which, when averaged, reduce the overall background noise effect. Unreliability of the measurements is another problem of FFT-based methods and is a direct result of the sensitivity of the FFT-based methods to the background noise. In addition to the need to increase the measurement time, the tests are usually required to be conducted in low noise environments such as sound-proof booths.

In an attempt to devise high performance DPOAE estimation techniques, linear adaptive signal processing techniques have been employed. Such techniques generally offer better performance in terms of measurement time, which may be interpreted as higher noise immunity of adaptive techniques compared to FFT; however, the need for sound-proof examination rooms is not obviated with such techniques.

BRIEF DESCRIPTION OF THE DRAWINGS

In the accompanying drawings like reference numbers denote like components, brief description of each of which is herewith given.

FIGS. 18a and 18b illustrate, by way of example, performance of an audiometer configured according to one of the described embodiments for the extraction of DPOAE in a noisy environment, wherein FIG. 18b is an expanded portion of FIG. 18a; and FIGS. 19a and 19b illustrate, by way of example, performance of an audiometer configured according to one of the described embodiments for the extraction of DPOAE in a noisy environment, wherein FIG. 19b is an expanded portion of FIG. 19a.

DETAILED DESCRIPTION

Figure 1:
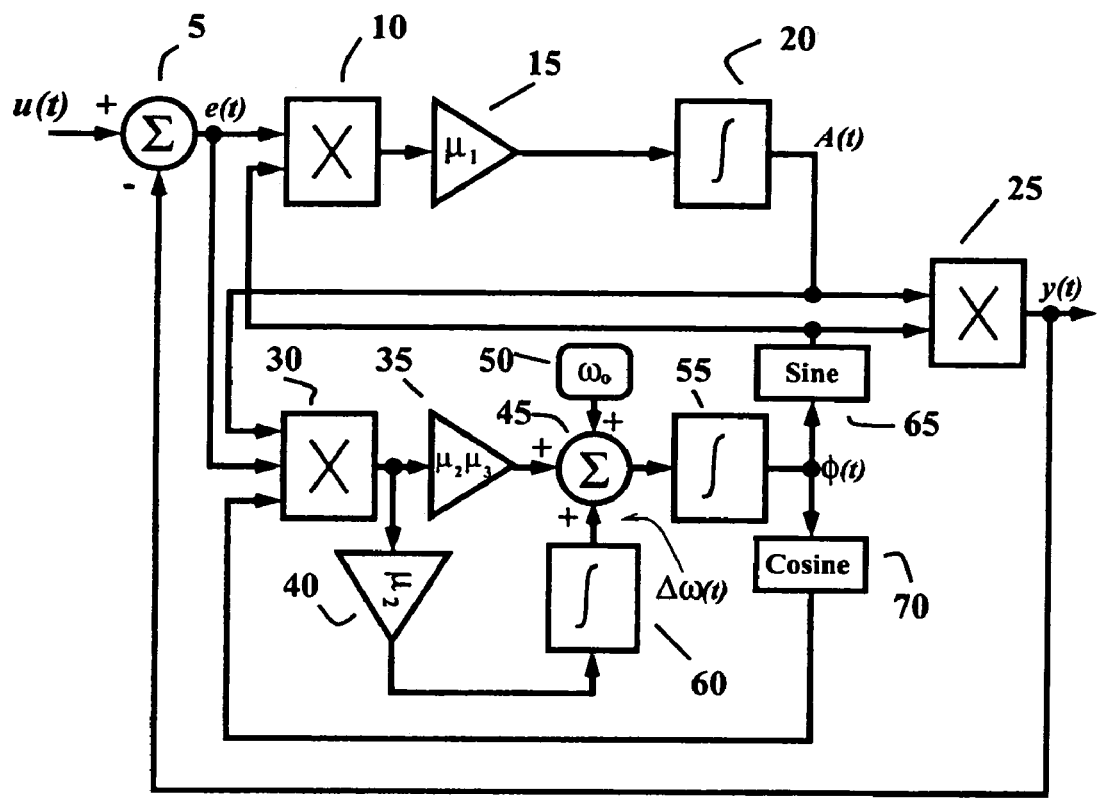
FIG. 1 shows a general structural block diagram of a system embodiment described herein.

This patent describes embodiments of apparatus, systems, algorithms and methods of extraction and estimation of the parameters of individual constituting sinusoids present in a given signal. The described embodiments offer an alternative to standard Fourier transform or linear adaptive filtering as regards signal analysis, and to phase-locked loops as regards signal synthesis while maintaining a structural simplicity and high speed of convergence both comparable with those of Fourier-based techniques. Unlike Fourier-based techniques, once the individual constituting components of a given signal are extracted, time variations in the characteristics of the components are registered and tracked.

An apparatus, system, algorithm or method in accordance with one or more of the described embodiments may provide for the extraction of a more or less specified desired sinusoidal component of a given signal, characteristics of which such as its amplitude, phase and frequency may vary with time. Accordingly, synthesization of a signal synchronous with a desired component of a given reference time-varying signal is possible, thereby rendering a signal synthesis tool.

An apparatus, system, algorithm or method in accordance with one or more of the described embodiments may provide for the estimation of time-varying parameters of a more or less specified sinusoidal component of a given signal such as its amplitude, constant and total phase, and frequency. Accordingly, detection and measurement of characteristics of constituting components of a given signal is possible, thereby rendering it a time-frequency analysis tool.

An apparatus, system, algorithm or method in accordance with one or more of the described embodiments may provide for the extraction of a more or less specified sinusoidal component of a given signal which may be highly polluted by noise and may be distorted by various external disturbances. Advantageously, a noise-free signal synchronous with a desired component of a given time-varying signal which may be polluted by noise may be detected, thus featuring it as a noise elimination/reduction technique. Also advantageously, a high degree of noise immunity is possible, thus a tool suitable for analysis of intensely noisy time-varying signals is possible.

An apparatus, system, algorithm or method in accordance with one or more of the described embodiments may provide structural simplicity so that the computational needs are comparable with those of simple Fourier-based techniques.

An apparatus system, algorithm or method in accordance with one or more of the described embodiments may provide for enhanced efficiency in terms of convergence time comparable with that of Fourier-based techniques.

The apparatus, systems, algorithms and methods according to the described embodiments relate to signal processing techniques and systems and, in particular, to a method of extraction of sinusoidal signals of time-varying nature. An apparatus built on the basis of such a method is capable of extracting a specified single sinusoidal component of an input signal, potentially containing other components and noise, and tracking variations of the amplitude, phase and frequency of such a sinusoid over time. Various apparatus, systems, algorithms and methods according to the described embodiments are generally referred to herein as a signal analysis/synthesis tool or simply "tool" or "core unit," which may be used in isolation or as the fundamental building block of single-core or multi-core systems. This tool or core unit therefore finds application in diverse areas of engineering and science, ranging from signal detection, extraction, measurement and synthesis in engineering to time-frequency analysis of mechanically generated signals in science. Some examples of its applications are the detection of dualtone multi-frequency (DTMF) signals in telephony, signal recovery in noisy biopotential signals, audiometry and extraction and measurement of power line signals.

The instant disclosure is provided to further explain in an enabling fashion the best modes of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented with or in software programs or instructions and integrated circuits (ICs), such as application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts in accordance to the present invention, further discussion of such software and ICs, if any, will be limited to the essentials with respect to the principles and concepts of the preferred embodiments.

According to the described embodiments, a tool for extraction of individual constituting sinusoidal components of a given signal may include a number of simple steps to provide estimated values of the amplitude, phase and frequency of a more or less specified component of a given signal as well as the synthesized desired component itself. Referring to FIG. 1, let u(t) represent a signal which is registered by a sensor to indicate a natural phenomenon or is artificially generated by the use of some equipment. It is usually taken to be a function of time t although it can equivalently be a function of any other variable, and may be of an electromagnetic nature, such as voltage or current signals in electrical systems, or of a mechanical nature such as sound waves. Very often, signals exhibit some periodicity in which case they can be represented as a series of individual sinusoidal components. If a signal is not perfectly periodic and its characteristics happen to change over time, so will the parameters of constituting sinusoidal components. In such cases, it is desirable to extract individual constituting sinusoidal components and track their variations over time.

The input signal u(t) is used to obtain an output signal y(t) which is the desired constituting component of such a given signal. Such a synthesized output signal is subtracted from the given input signal by a subtraction operation 5. The outcome of such an operation is another signal e(t) which, by the very fact that it is the difference between the given input signal and the synthesized desired component, is the totality of the undesirable components and the error incurred in the extraction process. This operation can be concisely formulated by the following equation:

$$e(t)=u(t)-y(t) \tag{1}$$

The instantaneous rate of change, or equivalently time derivative, of the amplitude of the desired component of the signal is taken to be proportional to the error signal e(t) and the sine of the total estimated phase of the desired component, and hence it is proportional to their product. Therefore, a multiplication operation 10, provides the product of the error signal e(t) and the sine of the total estimated phase of the desired component. Thus, a proportionality constant $\mu_1$ 15, when multiplied by the outcome of the product operation 10, yields the instantaneous rate of change of the amplitude of the desired component which, when integrated by an integration operation 20, provides the estimated value of the amplitude of the desired component of the input signal. The value of the initial condition of the integration 20 can be taken as zero in which case the tool is initialized from zero amplitude. It is easy to formulate the procedure just outlined for the estimation of instantaneous value of the amplitude of the desired component of a given input signal by the following equation:

$$\dot{A} = \mu_1 e \sin \phi, \quad (2)$$

where the dot on top denotes the time derivative, and A and φ denote the amplitude and phase, respectively.

Quite similarly, the instantaneous rate of change of the frequency of the desired component of the input signal may be taken to be proportional to the error signal e(t), the estimated value of amplitude A(t) and the cosine of the total estimated phase of the desired component, and hence it is proportional to their product. Therefore, a multiplication operation 30 provides the product of the error signal e(t), the estimated value of the amplitude A(t) and the cosine of the total estimated phase of the desired component. Thus, a proportionality constant $u_2$ 40, when multiplied by the outcome of the product operation 30, yields the instantaneous rate of change of the frequency of the desired component which, when integrated by an integration operation 60, provides the estimated value of the frequency of the desired component of the input signal. The value of the initial condition of the integration 60 can either be taken as zero in which case the tool finds the sinusoidal component of the input signal whose frequency is closest to zero, or can be set to any desired initial frequency $$f_o = \frac{\omega_o}{2\pi}$$

in which case the tool finds the sinusoidal component of the input signal the frequency of which is closest to such a desired value $f_o$. This conveniently provides for specifying the desired component of the input signal the extraction of which is sought. The extracted component of the signal will therefore be the one angular frequency that is closest to the value of the initial condition $\omega_o$ 50. It is easy to configure the tool for the estimation of the instantaneous value of the frequency of the desired component by the following equation:

$$\dot{\omega} = \mu_2 e A \cos \phi, \quad (3)$$

where ω represents the value of the angular frequency of the desired component of the input signal; frequency f in Hz is $$f = \frac{\omega}{2\pi}.$$

The instantaneous rate of change of the total phase of the desired component of the input signal is the sum of the angular frequency ω itself and a constant factor of its instantaneous rate of change. This can be formulated as:

$$\dot{\phi} = \omega + \mu_3 \dot{\omega}, \quad (4)$$

or with reference to the procedure of obtaining the estimation of frequency formulated by equation numbered (3), as:

$$\dot{\phi} = \omega + \mu_2 \mu_3 e A \cos \phi.$$

Thus, a combined constant factor $\mu_2\mu_3$ 35 provides the scaled product which is then added to the angular frequency by an addition operation 45 to yield the instantaneous rate of change of the total phase of the desired component of the signal which, when integrated by integration 55, yields the estimated value of the phase of the desired component of the input signal. The value of the initial condition of the integration 55 can be taken as zero in which case the tool is initialized from zero phase. The sine function 65 and the cosine function 70 generate the sine and cosine of the estimated total phase. The function of the sine operation 65 and cosine operation 70 can be interchanged without any effect on the performance since this would only mean a different initial condition of integration 55.

The desired component of the input signal is a single sinusoid having an amplitude of A(t) and a phase of φ(t) and can therefore be generated by multiplying the amplitude and the sine of the phase of the desired component by a product operation 25. This operation may be formulated as:

$$y(t) = A \sin \phi. \quad (5)$$

Equations (1) to (5) summarize the steps of a tool according to one of the described embodiments. When put together, the equations are $$\dot{A} = \mu_1 e \sin \phi,$$

$$\dot{\omega} = \mu_2 e A \cos \phi,$$

$$\dot{\phi} = \omega + \mu_3 \dot{\omega},$$

$$y(t) = A \sin \phi,$$

$$e(t) = u(t) - y(t).$$

It has been observed that the nonlinear non-autonomous dynamical system represented by the above set of differential equations possesses a unique asymptotically stable periodic orbit which lies in a neighborhood of the orbit associated with the desired component of the function u(t). In terms of the engineering performance of the tool, this indicates that the output of the system y(t)=A sin φ will approach a sinusoidal component of the input signal u(t). Moreover, the slow variations of the parameters in u(t) may be tolerated by the tool.

The convergence speed in tracking variations in the amplitude of the input signal is observed to be mainly controllable by the assignment of the value of the parameter $\mu_1$. The larger $\mu_1$ is chosen, the faster the tool follows variations in amplitude. The inherent trade-off existing in tracking capability is with accuracy. The larger $\mu_1$ is chosen, the higher level of error is introduced in the convergence mechanism. Likewise, the assignment, of values of parameters $\mu_2$ and $\mu_3$ provides for controlling phase-frequency tracking speed versus accuracy. Roughly speaking, the larger the value of $\mu_2$ is assigned, the faster the tool follows variations in the phase and a higher convergence error occurs.

One way of improving the aforementioned speed/error trade-off is the introduction of low pass filters before or after, or equivalently within, the integration operations 20 and 60. This allows for the assignment of large values of parameters $\mu_1$ and $\mu_2$ while maintaining the error within a given desired range.

FIG. 1, while outlining the detailed steps of a tool according to one of the described embodiments, shows the implementation in the form of the composition of simple blocks, and therefore presents a tool for the extraction of sinusoids of time-varying nature. Such tool may be implemented using digital hardware in which case digital circuits are used to perform the required arithmetic operations. An example of such an embodiment of a tool may be implemented on a field programmable gate array,(FPGA) platform.

Alternatively, analog circuitry may be employed to construct the blocks of the tool shown in FIG. 1.

Other arrangements, such as one employing mechanical components to perform arithmetic tasks, may be constructed.

Yet alternatively, the tool can be easily implemented numerically within a software environment. Such a software code may then be executed by the use of computers, microprocessors, microcontrollers or digital signal processor (DSP) platforms or other computational devices. Numerically, one, and not the only, possible way of expressing the set of equations governing the method of the invention in discrete form is:

$$A[n+1]=A[n]+\mu_1 T_s e[n]\sin \phi[n], \quad (6)$$

$$\omega[n+1]=\omega[n]+\mu_2 T_s e[n]\cos \phi[n], \quad (7)$$

$$\phi[n+1]=\phi[n]+T_s\omega[n]+\mu_2\mu_3 T_s e[n]A[n]\cos \phi[n], \quad (8)$$

$$y[n]=A[n]\sin \phi[n], \quad (9)$$

$$e[n]=u[n]-y[n], \quad (10)$$

where a first order approximation for the derivatives is assumed, $T_s$ is the sampling time and n is the index of iteration.

The tool for signal analysis and synthesis is general in the sense that it offers a signal processing tool capable of extracting a desired sinusoid which may undergo variations in all three parameters amplitude, phase and frequency. Very often, the component of interest is specified in terms of its frequency implying a priori that the frequency is more or less known and almost fixed. In such situations, the tool implemented on that basis can be further simplified For this matter, supposing that the frequency is more or less fixed around $\omega_o=2\pi f_o$, one can rewrite the equations for the tool and obtain $$\dot{A}=\mu_1 e \sin \phi,$$

$$\dot{\phi}=\omega_o+\mu_2 eA \cos \phi,$$

$$y(t)=A \sin \phi,$$

$$e(t)=u(t)-y(t).$$

It is noteworthy that here the parameter $u_2$ is reused and is equal to $u_2u_3$ 35 of FIG. 1. Another special case is when the parameter $u_3$ is taken to be zero, yielding the following set of equations:

$$\dot{A}=\mu_1 e \sin \phi,$$

$$\dot{\omega}=\mu_2 eA \cos \phi,$$

$$\dot{\phi}=\omega,$$

$$y(t)=A \sin \phi,$$

$$e(t)=u(t)-y(t).$$

The tool outlined by these equations is observed to perform well under more or less fixed frequency condition. This is similar to the first special case in terms of performance. It is not as simple. The compensating advantage is that like the general case a direct estimation of the frequency is available, an estimation which is more or less a constant quantity.

The two special cases just mentioned do not have to be classified separately as they automatically result from the general case under specific conditions. Another special case arises when one eliminates the amplitude term in equation (3) of the set of equations. This special case is of particular importance in the sense that it does not automatically result from the general case and has to be considered separately. In this case, the equations may be written as $$\dot{A}=\mu_1 e \sin \phi,$$

$$\dot{\omega}=\mu_2 e \cos \phi,$$

$$\dot{\phi}=\omega+_3\dot{\omega},$$

$$y(t)=A \sin \phi,$$

$$e(t)=u(t)-y(t).$$

This alternative procedure and the tool implemented thereupon are also observed to perform well under all possible conditions.

The tool, mathematically described by the equations throughout this disclosure, refers to a dynamical system which may be described in many other ways. For example, it is known in the art that a given set of equations can be converted to an alternative set of equations by an act of change of variables. For instance, equations (1) to (5), or those describing special cases of the latter, are framed in cylindrical coordinate system having dimensions (A, $\phi$, $\omega$). Obviously, a change of variables may be employed to frame the same equations in Cartesiani coordinates system. As another example, it is known in the art that the parameters $\mu_1$, $\mu_2$ and $\mu_3$, being arbitrary positive numbers yet to be determined according to a specific application, may be replaced by other positive quantities such as $\mu_1 A^{2k}$, $\mu_2 A^{2k}$ and $\mu_3 A^{2k}$, A and k being the amplitude and an arbitrary integer, respectively. Variations of this sort, exemplified by the two change of variables just mentioned, although result in equations of different appearance, are essentially the same as the general case described in this disclosure and are not considered separately.

The dynamics of the tool presents a notch filter in the sense that it extracts (i.e. lets pass through) one specific sinusoidal component and rejects all other components including noise. It is adaptive in the sense that the notch filter accommodates variations of the characteristics of the desired output over time.

The analogy with notch filters should not limit the applicability of the tool. From a different perspective a number of core units configured to be employed in parallel, can be thought of as a frequency domain analysis tool, such as Fourier transform. From an entirely different perspective, the present technique presents a new PLL structure, as will be described below.

Figure 2:
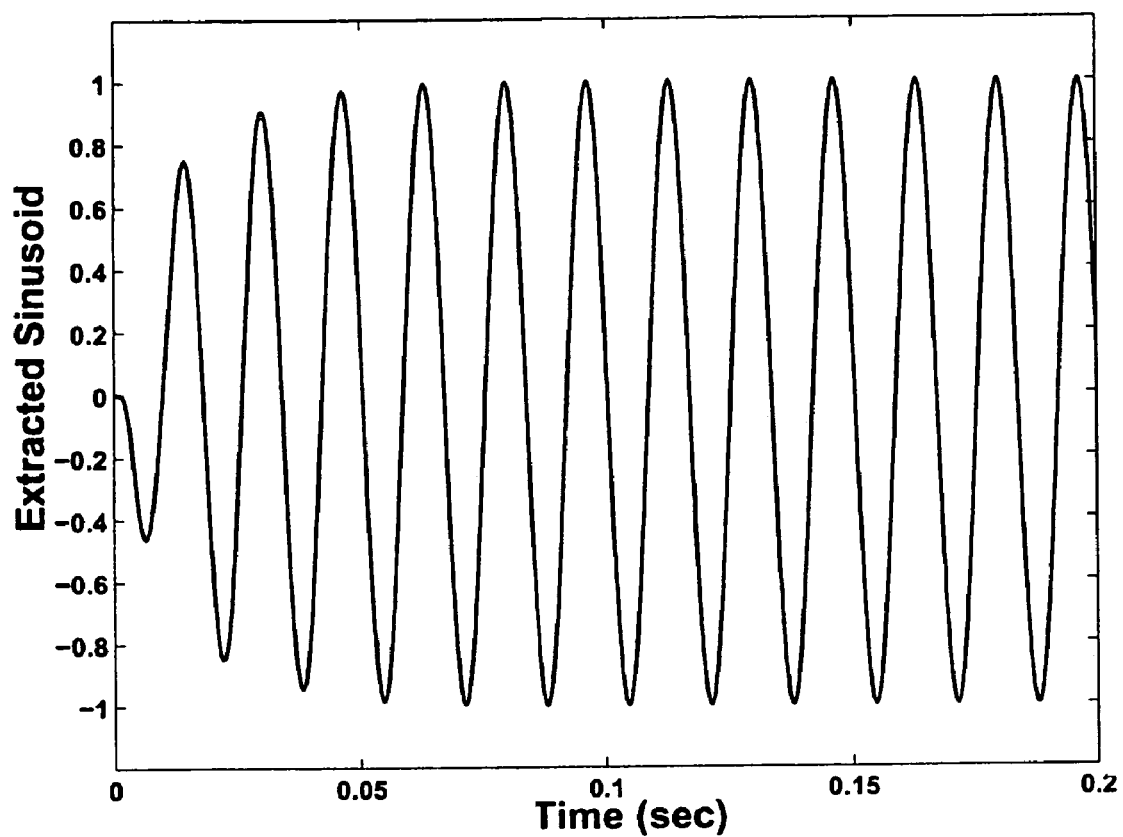
FIG. 2 illustrates, by way of example, the performance of a system or method according to the described embodiments described herein in extracting a sinusoidal signal.

To illustrate the performance of the tool, a number of simulations are now presented. FIG. 2 shows the extracted signal of an input of unit amplitude pure sinusoid with frequency f=60 Hz and random phase. The initial conditions are chosen as $f_o$=50 Hz, $A_o$0, and $\phi$=0. With a moderate set of parameters, $\mu_1$=200, $\mu_2$=20000, $\mu_3$=0.02, the convergence is achieved in a few cycles.

Figure 3:
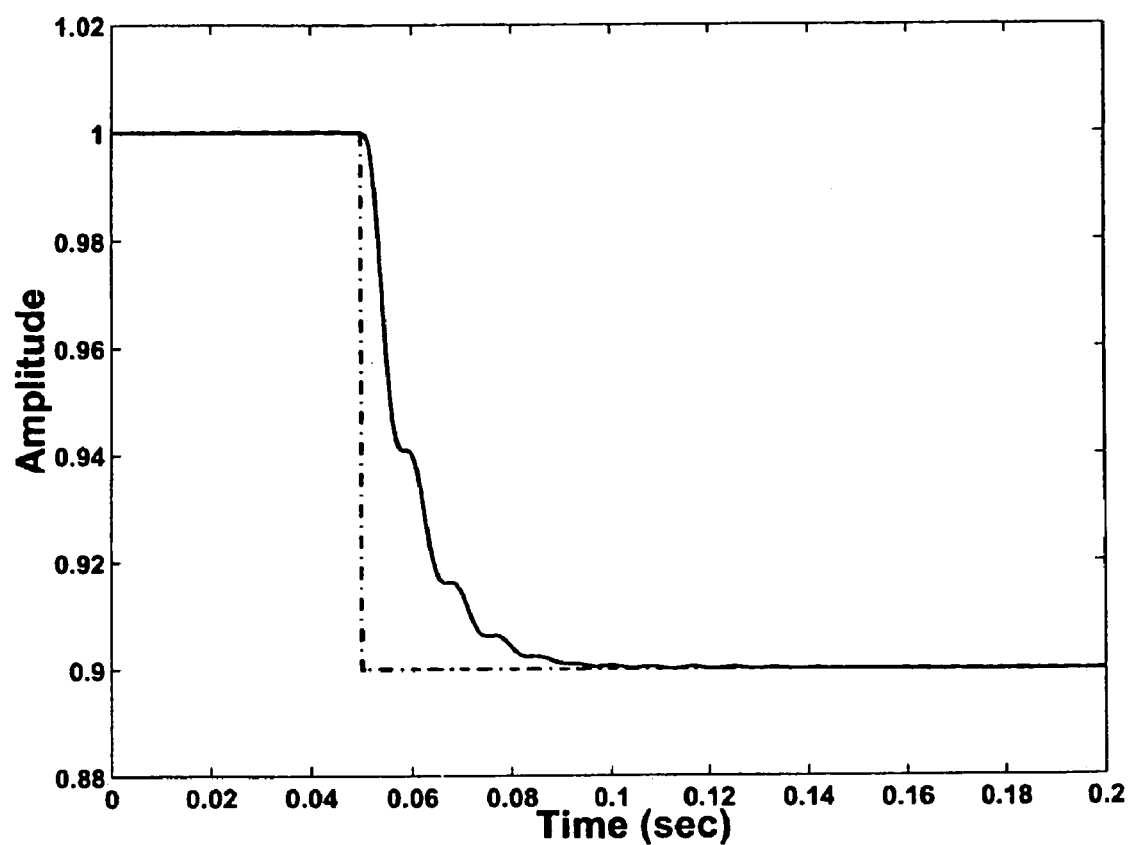
FIG. 3 illustrates, by way of example, the performance of a system or method according to the described embodiments described herein in tracking a step change in the amplitude of the input signal.

FIG. 3 shows the performance of the tool in tracking time variations in the amplitude. A step change of 10% in the amplitude of the input signal, which is otherwise taken to be the same as before, occurs. The new value of the amplitude is tracked in a few cycles while the phase and frequency of the signal undergo transients for a few cycles.

Figure 4:
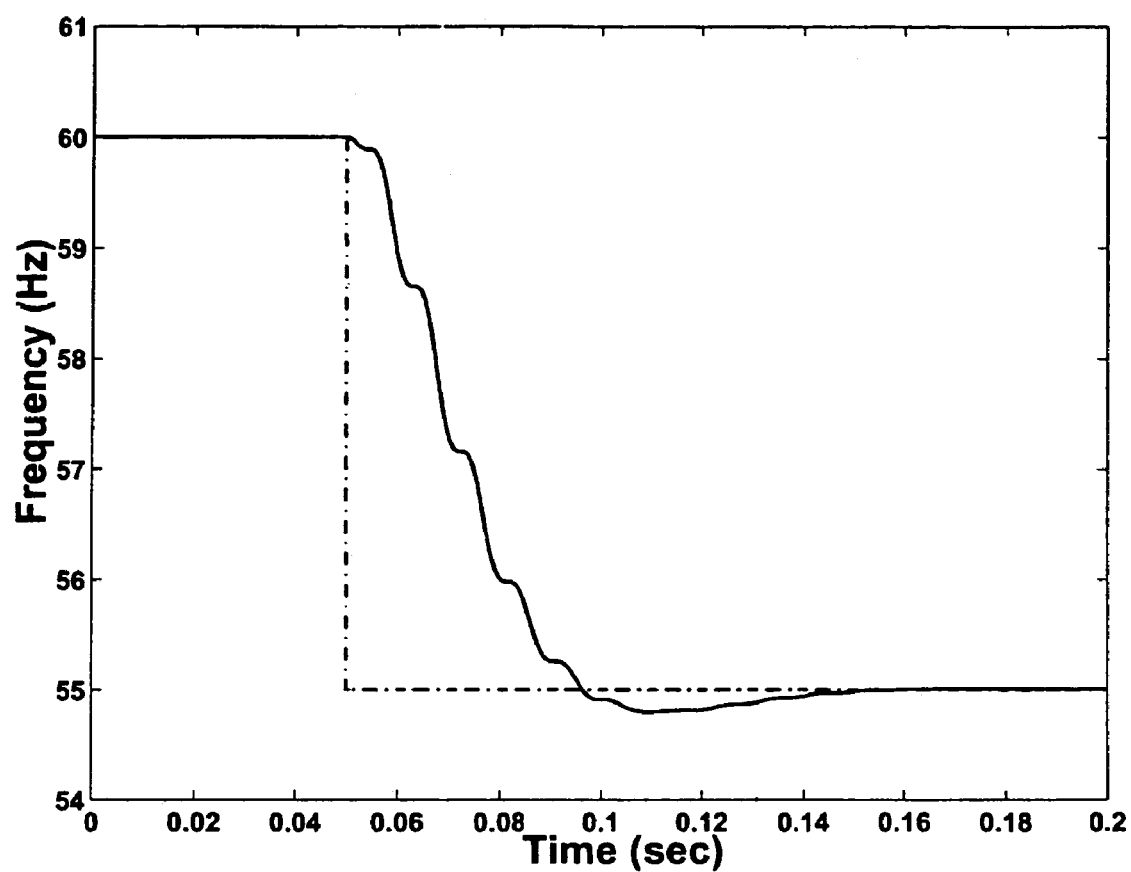
FIG. 4 illustrates, by way of example, the performance of a system or method according to the described embodiments described herein in tracking a step change in the frequency of the input signal.

FIG. 4 shows a similar phenomenon in which the frequency of the input signal undergoes a step change. It is observed that the variations are effectively tracked with a transient of a few cycles. Values of the parameters are retained the same as before.

As far as the robustness of the tool with regard to its internal structure, and most importantly with regard to the adjustment of parameters, it has been observed that performance of the tool is almost unaffected by parameter variations of as large as 50%. The tool is found extraordinarily insensitive to variations of even orders of magnitude in its internal setting. This merit is well appreciated in the context of some methods in which variations of the order of 0.1% may pose serious stability or performance problems.

Figure 5:
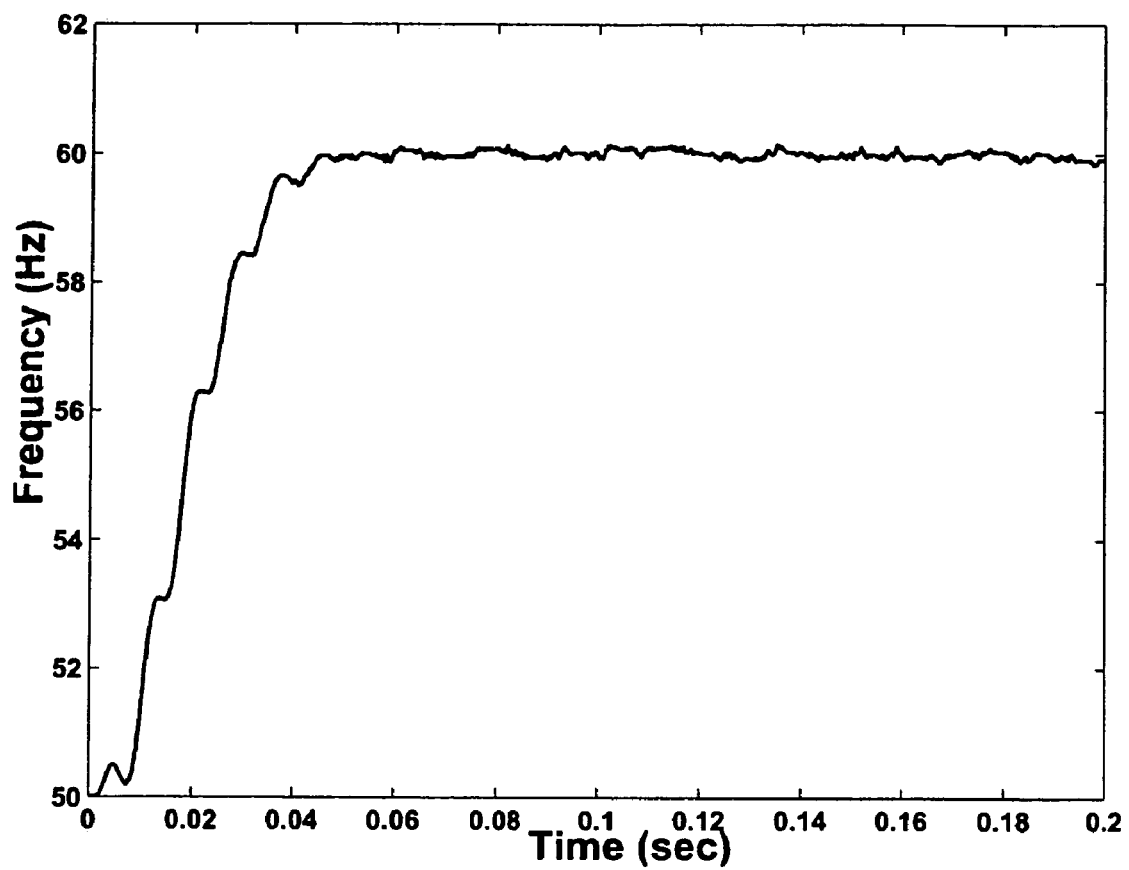
FIG. 5 illustrates, by way of example, the effect of the presence of noise.

In noisy environments, one cannot achieve the maximum speed of convergence without a trade-off with accuracy. FIG. 5 shows the performance of the tool in noisy environments. It is the same scenario as that of FIG. 2 with the only difference that a white noise at the 20 dB below the level of sinusoidal input (i.e. of 10% of the magnitude) is added to the input signal. The extracted frequency is picked as an index of performance. It is found that the presence of 10% noise in the input generates an error of about 0.5% in the frequency estimation at the same speed of convergence. It is notable that for each given application, one can modify the values of $\mu$-parameters to accordingly balance the speed and accuracy.

The tool is extremely simple. To elaborate further on this fact, a comparison is now made between the tool and the discrete Fourier transform (DFT). DFT is well-known for its simplicity of structure and hence its short execution time or little computational demand if implemented numerically in a software environment. Using DFT, if written out in recursive form, the real and imaginary parts of the fundamental phasor, for example, of the input signal u(t) can be iteratively computed as:

$$a_1[n] = a_1[n-1] + \frac{2}{N}(u[n] - u[n-N])\cos\left(\frac{2\pi n}{N}\right), \quad (11)$$

$$b_1[n] = b_1[n-1] + \frac{2}{N}([n] - u[n-N])\sin\left(\frac{2\pi n}{N}\right) \quad (12)$$

where u[n-N] is the input sample corresponding to the previous period which is saved in memory. The fundamental component of u(t) is expressed as:

$$u_1(t) = A_1 \sin(\omega_o t + \theta_1), \quad (13)$$

in which $A_1$ and $\theta_1$ can be calculated from (11) and (12) by:

$$A_1 = \sqrt{a_1^2 + b_1^2}, \quad (14)$$

$$\theta_1 = \tan^{-1}\left(\frac{b_1}{a_1}\right). \quad (15)$$

The two recursive equations have very simple structure. Two multiplications are the major computations involved. However, as many samples as the window length should be saved in the memory. Note that a relatively large amount of computation is required to provide a signal $\mu_1(t)$ out of $a_1$ and $b_1$. A square root and an arctangent operation are to be performed. These two functions are riot straightforward to implement and need a considerable amount of memory and hardware. Moreover, further work has to be done to synthesize a synchronous signal $\mu_1(t)$, using a PLL or example.

Since the tool is not window based, no input data is required to be saved in the memory. It only needs to have the instantaneous value of the input. To compare the tool with DFT from the computational order point of view, one needs to consider all the required computations by both methods to provide the same result. DFT needs to do all the computations in equations (11) to (15) to provide a fundamental, its amplitude, and its phase angle. The tool needs to perform the computations in the set of equations (6) to (10) to provide the same results. It is obvious that the tool lends itself more easily than DFT to the practical implementation in terms of computational volume of the software. From a hardware point of view, since the extracted fundamental and distortion are directly available, there is no need for any synchronizing function such as PLL to implement the tool.

Figure 6:
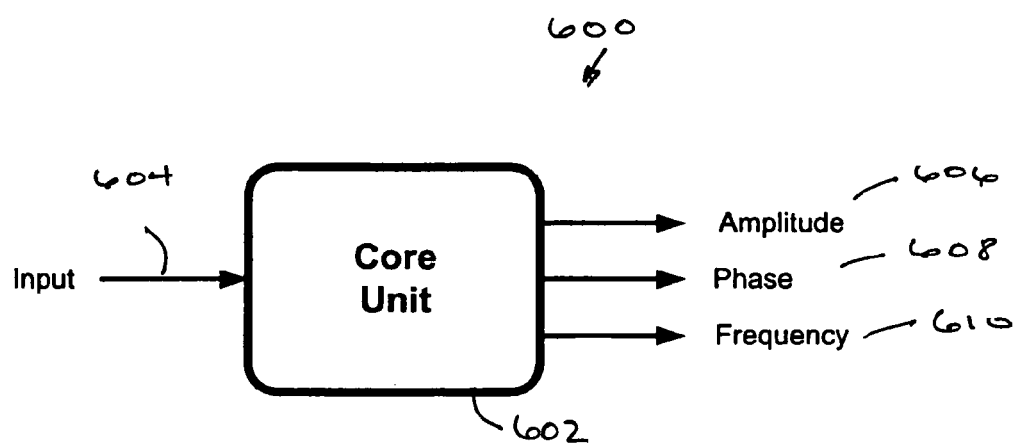
FIG. 6 depicts a functional block diagram of a system according to another of the described embodiments.

From one perspective, the tool is an adaptive amplitude, phase and frequency estimator 600. This functional description of the invention is pictured in FIG. 6, wherein a core unit 602 is adapted to receive an input signal 604 and to provide amplitude 606, phase 608 and frequency 610 output signals. In this sense, the tool belongs to the general category of signal estimation systems and methods such as those widely employed in phasor measurement. It can also be thought of as an adaptive notch filter whose center frequency is adjustable and is flexibly moving. In this sense, it is comparable with adaptive filters. It can be envisaged as a signal analysis tool which analyzes individual components of frequency decomposition of a given signal. In this sense, it is comparable with DFT.

Figure 7:
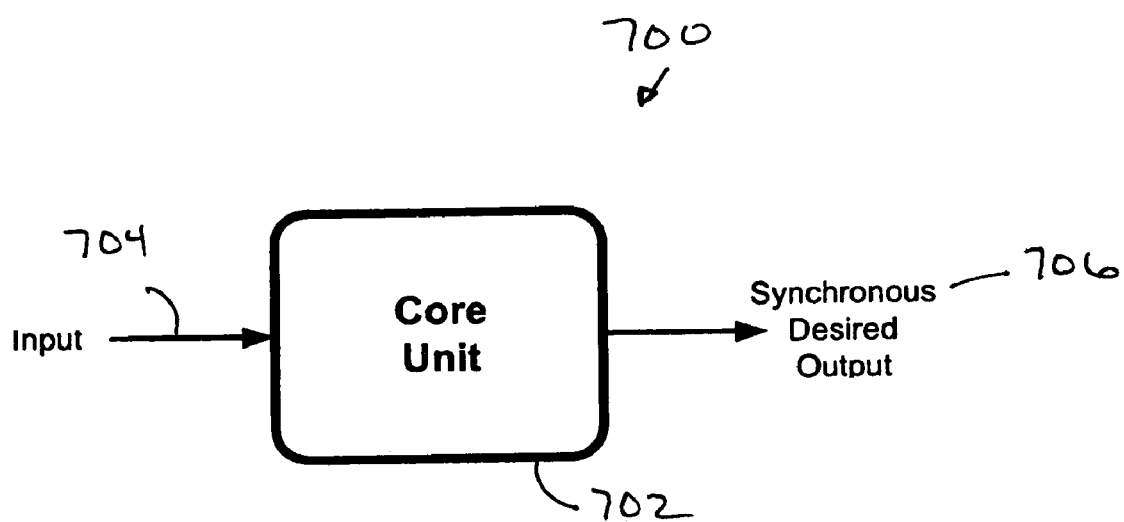
FIG. 7 depicts a functional block diagram of a system according to another of the described embodiments adapted as a phase-locked loop (PLL)

Unlike most signal processing techniques which provide estimates of characteristics of the components of a given signal, the tool not only does provide estimates of the amplitude, total or constant phase and frequency, but also synthesizes the desired sinusoidal component itself in real time. This is feasible due to the fact that the total phase is estimated at each instant. From this perspective, the present invention is a new PLL 700 as pictured in FIG. 7, wherein a core unit 702 is coupled to receive an input 704 and provide a synchronous output 706.

Figure 8:
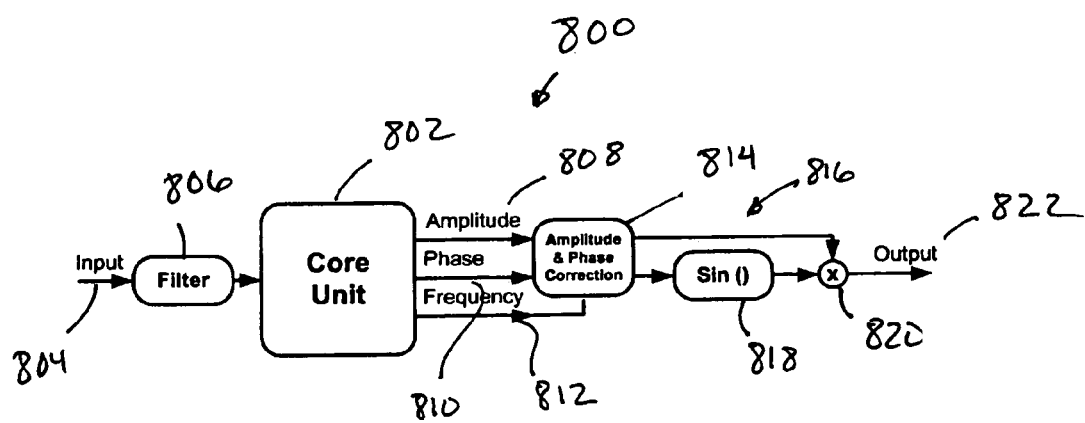
FIG. 8 depicts a functional block diagram of a system according to another of the described embodiments incorporating a filter to enhance its performance.

The input signal, out of which the system is supposed to extract a clean single sinusoid, may contain components lying in frequency bands far off that of interest. A filter may be inserted at the input of the core unit to eliminate some of the undesired components and thus enhance the speed-accuracy tradeoff of the tool. Obviously, this filter does not need to be sharp meaning that its structure is very simple and the phase delay will not be excessively long. The phase delay and the gain of the filter will be functions of frequency. The tool, by the very fact that it synchronously estimates frequency, amplitude and total phase, allows for the correction of the phase delay and change in amplitude. The estimation of frequency at each instant may be used to obtain the phase delay caused by the filter. Such a quantity is then subtracted from the total phase which is also instantly generated. Likewise, the amplitude can be corrected. The desired output can then be simply synthesized as illustrated in FIG. 8. As shown in FIG. 8, an input signal 804 is coupled via a filter 806 to a core unit 802. The core unit 802 provides amplitude 808, phase 810 and frequency 812 outputs. The outputs 808–812 are coupled to an amplitude and phase correction unit 814 which provides an amplitude and phase corrected output 816. The sine of the corrected output is provided by a sine component 818, and the product of the sine and the output 816 is provided by the multiplication function 820 to provide an output signal 822. A particular example of an application of the configuration of FIG. 8 is a power signal interference eliminator. Such a device may include a filter such as that shown in FIG. 8 to extract the interfering power line signal that is then subtracted from the input to provide a clean signal out of which the power signal is removed.

Figure 9:
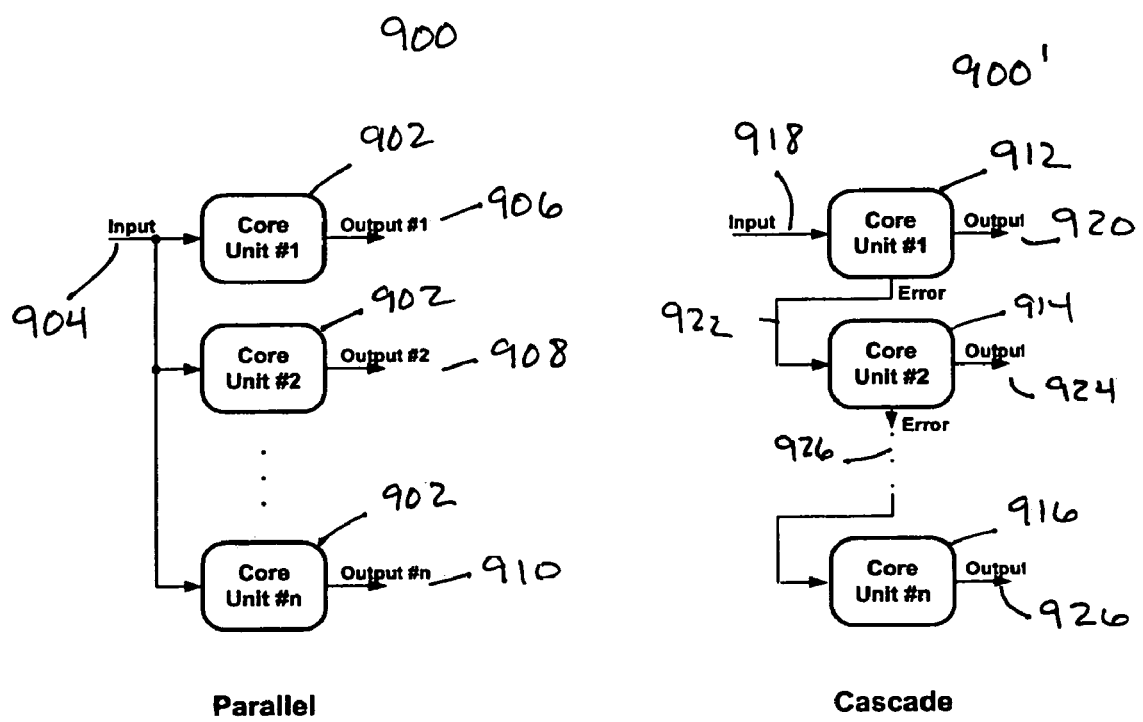
FIG. 9a depicts a functional block diagram of a system according to another of the described embodiments incorporating a plurality of core elements in parallel combination.
FIG. 9b depicts a functional block diagram of a system according to another of the described embodiments incorporating a plurality of core elements in cascade combination

As a signal analysis tool, a number of core units, or configurations of FIG. 8 as core units for improved performance, may be connected in parallel, or cascaded, to decompose the multi-component input signal into its constituting sinusoidal components. FIGS 9a and 9b shows two possible combinations 900 and 900'. In FIG. 9a, a plurality of core units 902 are coupled in parallel to receive an input signal 904 and to respectively provide output signals 906–910. In FIG. 9b, a plurality of core units 912–916 are coupled in series/cascade. The first core unit 912 is coupled to an input signal 918 and provides an output signal 920 and error signal 922. The error signal 922 is coupled as an input to the core unit 914, which provides an output signal 924 and an error signal 926. The error signal 926 is coupled as an input to the core unit 916, which provides an output signal 928.

Figure 10:
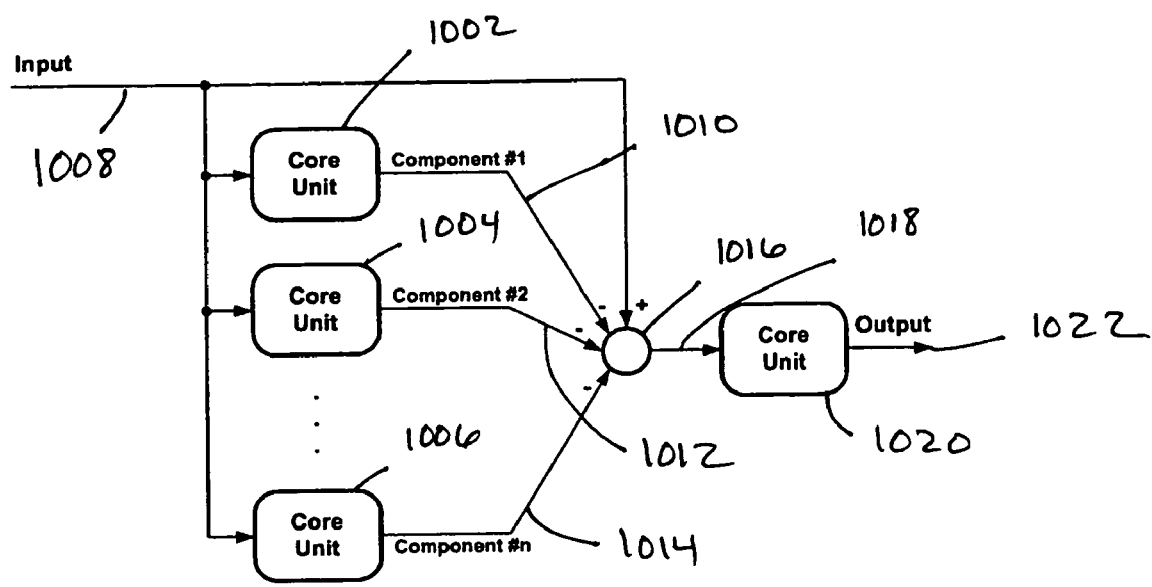
FIG. 10 depicts a functional block diagram of a system according to another of the described embodiments adapted for the elimination of undesirable components.

Of course, one can conceive of other combinations to build multi-core units tailored by needs of any given application. For example, if the desired component is masked by components of a more or less known frequency composition, undesirable components may be extracted and subtracted from the input signal first to provide a cleaner input for the core unit which is supposed to extract the desired component. FIG. 10 shows such a configuration. In FIG. 10, a plurality of core units 1002–1006 are coupled to received an input signal 1008 and to provide corresponding output signals 1010–1014. The output signals 1010–1014 are subtracted from the input signal 1008 by a subtractor 1016, the output 1018 of which is coupled as an input to the core unit 1020. The core unit 1020 provides an output 1022 based upon the signal 1020. It is noteworthy that each core unit tries to extract a sinusoidal component of the frequency that is closest to its specified initial condition. In order to avoid overlapping duties of the core units, the operating frequency of each of the core units has to be within a specified range. This can be achieved by introducing range limiters within frequency integration 60 of FIG. 1, for instance.

It will be appreciated from the foregoing discussion that the tool herein described, which is well suited for signal extraction and particularly of low level signals in noisy environments, may be adapted for use in audiometry to improve sensitivity and to reduce testing time. The following discussion and examples therefore focus on application of the tool in audiometry.

Figure 11:
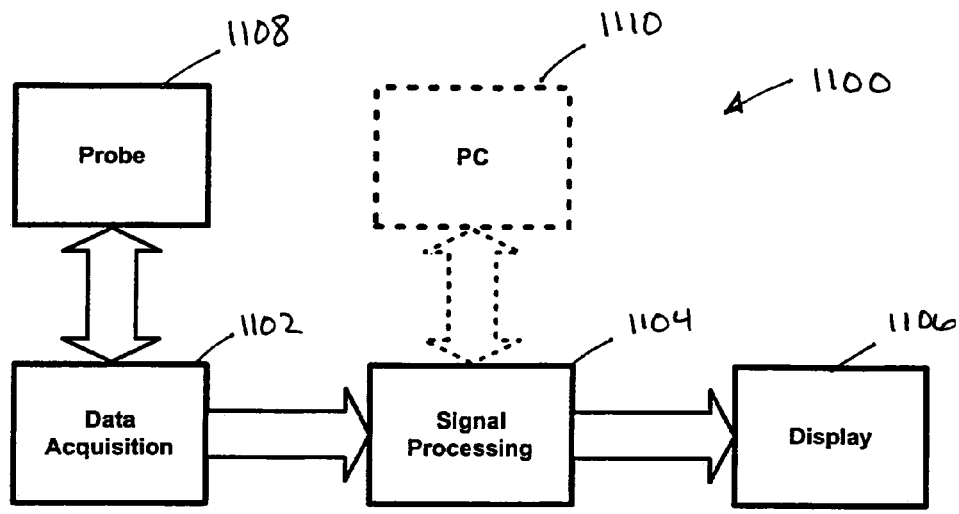
FIG. 11 depicts a function block diagram of a audiometer adaptable to operate in accordance with one or more of the described embodiments.

Referring t FIG. 11, an audiometer 1100 includes three main modules the data, acquisition/transducers module 1102, the signal processing module 1104, and the user interface 1106. A probe 1108 is coupled to the data acquisition module 1102, and a personal computer or other computational/data management device 1110 maybe coupled to the signal processing unit. The acquisition/transducer module 1102 and the signal processing module 1104 are described in more detail below. The user interface 1106 may include a data entry device, such as a keypad, keyboard, touch screen, mouse or other pointer device, voice activation and the like for accepting commands, data input and actions from a user. The user interface 1106 may also include a display and/or printer device for providing information to the user. The particular configuration of the user interface is not critical to operation of the audiometer 1100, and the user interface function may also be provided by the personal computer 1110. Thus, one of skill in the art given the nature of the data and commands to be accept and the information to be provided to the user would be capable of specifying a suitable user interface. For example, the user interface may be a laptop or palm-type computing device with a graphic user interface and a keypad, mouse, joystick, touch pad and/or voice recognition input device.

Figure 12:
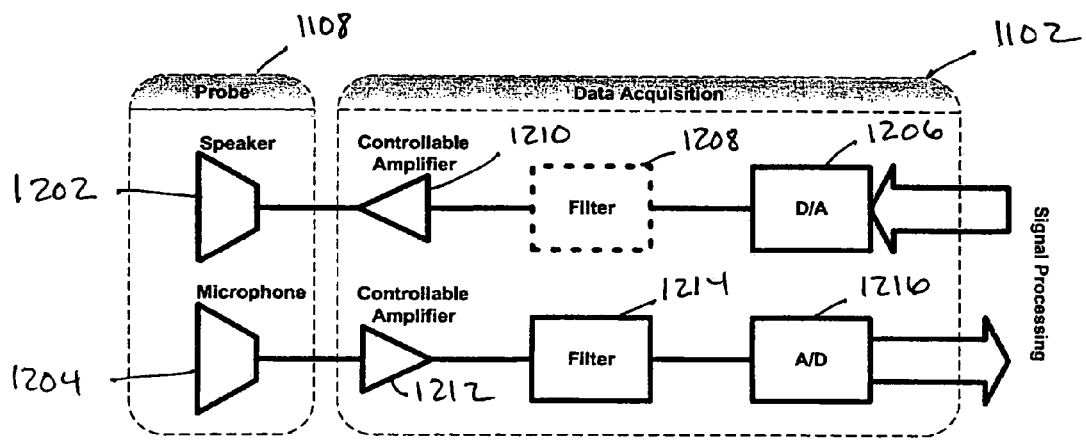
FIG. 12 is a detailed block diagram of the probe component and the data acquisition component of the audiometer depicted in FIG. 11.

Data acquisition unit 1102 is the medium between the processing unit 1104 and the probe 1108 which transmits and receives signals to the testing subject. For example, in DPOAE, the probe 1108 may include a transducer 1202 and a microphone 1204 for transmitting and receiving signals in the human audible range as shown in FIG. 12. For SSAEP, auditory brainstem response (ABR) or other types of evoked response audiometry, the probe may include an audio transducer for introducing a stimulus to the testing subject and electrodes for detecting an electroencephalogram (EEG) of the testing subject. It should be clear, however, that the probe 1108 may be configured for providing virtually any type of stimulus: auditory, electrical, haptic and/or visual and for receiving virtually any type of response signal: auditory, electrical, haptic and/or visual in connection with audiometry and/or other forms of objective patient testing. In that regard, one of the main functions of the module 1104 is to convert using a digital-to-analog converter 1206 digital signals produced by the signal processing module 1102 to stimulus signals, typically analog signals, which are then conditioned by optional filtering 1208 and amplification 1210 and converted to audio signals for transduction to the testing subject by the transducer 1202. Conversely, the response signals, audio or electrical signals as the case may by, recorded by the probe, are conditioned by amplification 1212 and filtering 1214 and converted be analog-to-digital converter 1216 to digital signals to be processed by the signal processing module 1102.

The signal processing module 1102 of the audiometer 1100 produces the digital form of the artifacts and extracts and measures the response signal. A DSP, or if the computational/architectural demand is low even a microcontroller, can be employed as the hardware platform of this unit. Signal processing is embedded as the software in such a hardware platform. Alternatively, and provided that the complexity of the signal processing algorithms remains low, signal processing unit may be implemented solely in hardware using programmable logic array (PLA) or field programmable gate array (FPGA) technology. In an ideal case, namely when the signal processing algorithm is not excessively complex, the hardware does not require a PC for its operation; however, interfacing to a PC is usually provisioned for data management.

Figure 13:
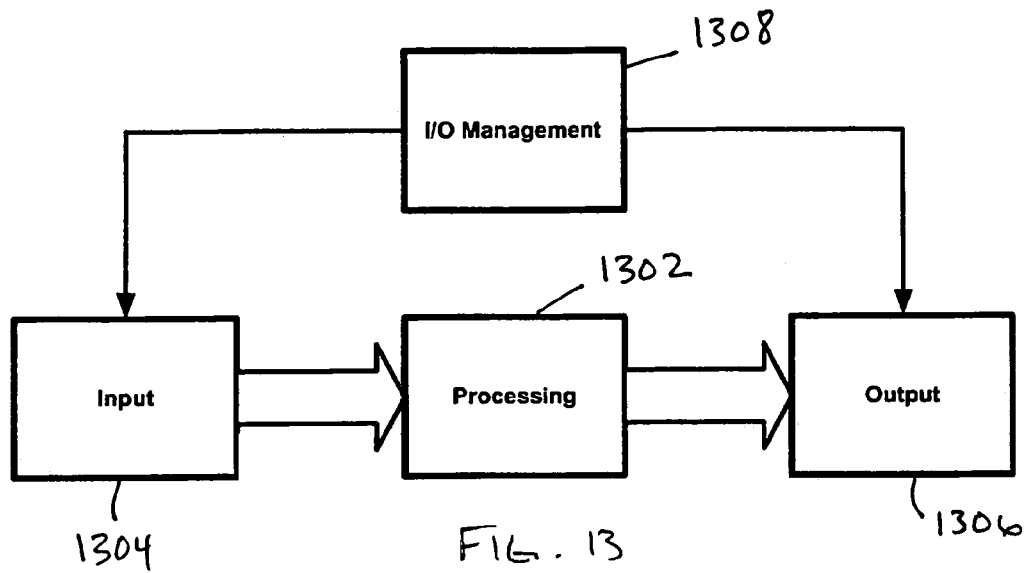
FIG. 13 is a functional block diagram illustrating a software architecture that may be used in the audiometer depicted in FIG. 11.

FIG. 13 shows the main functions of the software embedded in the signal processing module 1102. The software is essentially responsible for the generation of the artifact signals and extraction of response signals, i.e., processing portion 1302, as well as management of the input/output of data 1304–1308.

Figure 14:
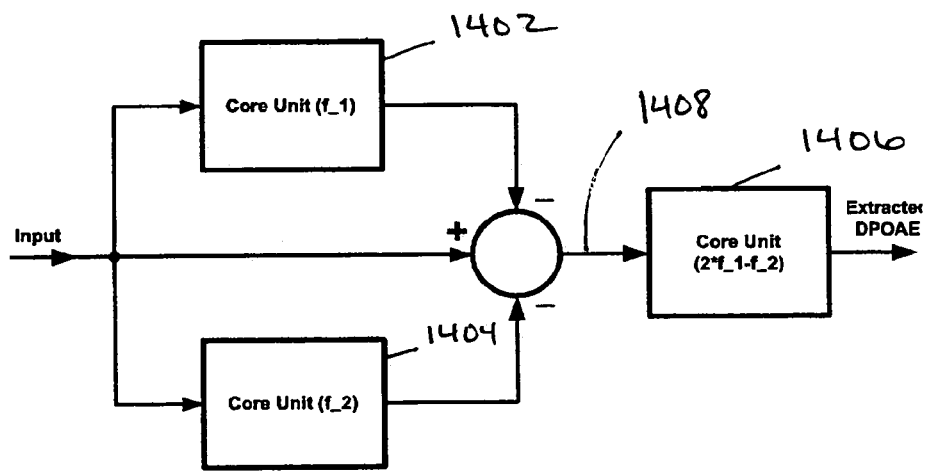
FIG. 14 is a functional block diagram of a signal processing scheme that may be used in the audiometer depicted in FIG. 11 for providing, DPOAE audiometery.

With reference now to FIG. 14, a signal processing scheme for the extraction of DPOAE is illustrated. One of ordinary skill in the art will appreciate that the principles herein described for the configuration of an audiometer, and particularly for extracting a response signal from artifacts and noise, may be used to construct a signal processing scheme for extracting transient or steady state evoked response signals, other forms of otoacoustic emission signals, and the like. The following example of a single processing scheme adapted for DPOAE therefore illustrates the general principles of the invention herein described and its adaptability and in no way should be considered limiting of the applicability of the general signal processing scheme to a particular form or type of audiometry. Moreover, it will be appreciated that it may be possible and/or desirable to provide input signal filtering, such as described in connection with the embodiments of a core unit illustrated in FIG. 8, and/or to provide enhanced core units, such as those illustrated in FIG. 10, to enhance signal extraction. Also, signal sampling frequency may be modified, i.e., increased or decreased, either alone or in combination with input signal conditioning techniques to enhance signal extraction. These input signal conditioning and sampling techniques may be particularly advantageous when attempting to extract auditory evoked potential signals.

The scheme employs three core units 1402–1406 to construct a high performance DPOAE extraction module 1400. Each core unit 1402–1406 is capable of focusing on and extracting a pre-specified sinusoidal component of its input signal which may contain many other components including noise. More importantly, each can effectively follow variations in the amplitude, phase (and frequency) of the extracted sinusoidal component. The underlying mathematics ensuring stability and performance of such core units 1402–1406 may be in accordance with any of the foregoing described structures, and thus, the structure of the core units remain extremely simple. They are found to be very robust with respect to variations in the internal settings as well as external conditions and exhibit superior performance over existing linear adaptive and FFT-based algorithms.

The input signal is often assumed to consist of two pure sinusoids with frequencies $f_1$ and $f_2$ at a very high level (usually about 60–70 dB) and a very low level DPOAE $2f_1-f_2$ at about 0 dB. It is polluted by a noise usually considered to be at about −10 dB level. The noise in fact represents the totality of all undesirable signals that may be present in the environment in which the examination is being conducted as well as unavoidable white Gaussian noise. While it is possible to use a single core unit to extract the DPOAE signal, because of the degree of pollution (artifacts and noise) use of multiple core units may provide better performance.

The first two core units 1402 and 1404 are set to extract the artifacts of the stimulus signal, i.e., frequencies $f_1$ and $f_2$. They effectively do so with very small errors. The extracted artifacts are then subtracted from the input to produce a signal 1408. DPOAE now has a higher relative portion of the signal 1408 because the artifacts have now been removed. The third core unit 1406 is then set to extract DPOAE. That is, the third core unit 1406 is configured to extract the very low level DPOAE $2f_1-f_2$ signal.

The core units 1402–1406 may be configured in digital or analog hardware or software with good results. The core units may also be configured in accordance with any of the algorithms herein described for the extraction of signals.

The performance of the audiometer 1100 configured to extract DPOAE can be measured with the use of computer simulations as demonstrated by the following examples, which are intended to demonstrate the capability of the audiometer 1100 and should not be taken as limiting of the scope of the patent.

The arrangement of FIG. 14 including the three core units 1402–1406 is used to extract DPOAE in a simulated environment. All the initial conditions are taken to be zero. The first two units 1402 and 1404 are employed to extract the artifacts and must do so with as small an error as possible to produce an input to the third unit containing DPOAE signal as a main component. Otherwise, the third unit may not be able to extract DPOAE signal with sufficient accuracy. Therefore, the parameters may be chosen relatively small, and for the described example they may be chosen as: $\mu_1=100$ and $\mu_2=50$. With these values, it is expected that the convergence is achieved within about 100 ms. The same setting may also be used for the third unit. Two forces oppose each other in the selection criteria for the values of the parameters of the third unit. On the one hand, since SNR is very low for the third unit (DPOAE being taken as the signal and the total residual errors of the first two units as the noise), the parameters must be very small. On the other hand, since the input has a very low level, the value of $\mu_2$ must be large. These two forces tend to cancel each other for the case of $\mu_2$ so that the original value of 50 remains a good choice. As for the value of $\mu_1$, one expects that it should be small to achieve acceptable accuracy in the extracted signal. This is true, but since only the amplitude of the extracted signal (i.e. the level of DPOAE) is of interest, one can substantially increase $\mu_1$. The accuracy in the estimated extracted signal (and not necessarily its amplitude) is thus traded off, which in this case is not of importance. The estimation of the amplitude remains accurate while the convergence speed is high enough. A rough setting of the values of parameters $\mu_1$ and $\mu_2$ can be done. The core unit algorithms have been shown to be very insensitive with regard to the settings of the parameters; variations as much as 50% in the values of these parameters seem to have practically no effect on the performance. The value of the amplitude directly estimated by the third unit was used as the estimate of the level of DPOAE.

Figure 15:
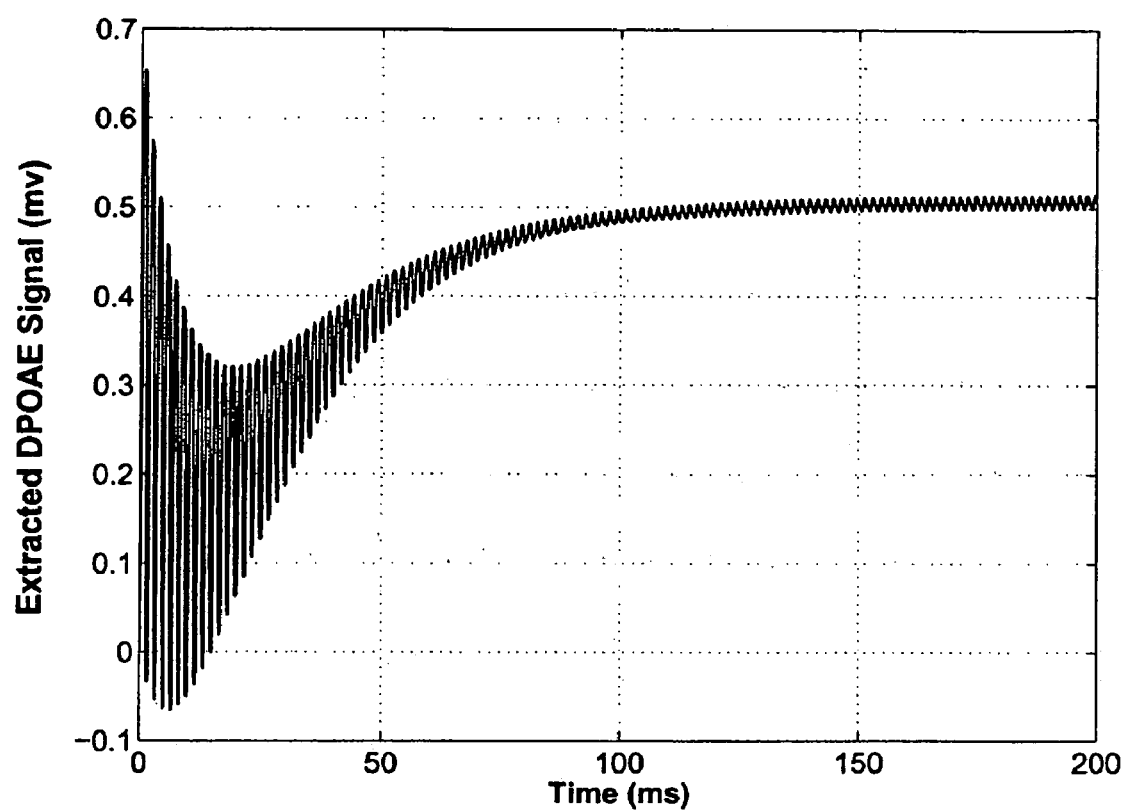
FIG. 15 illustrates, by way of example, performance of an audiometer configured according to one of the described embodiments for the extraction of DPOAE.

The input signal is synthesized by the summation of two artifacts at frequencies $f_1=3000$ Hz and $f_2=1.2\ f_1=3600$ Hz and the DPOAE signal at $2f_1-f_2=2400$ Hz. The amplitude of the artifacts are taken as 1 v and the DPOAE level is 0.5 mv. With these values, the level of the artifacts is set at about 66 dB higher than that of DPOAE. FIG. 15 shows the performance of the audiometer 1100. It is confirmed that the measurement is completed in about 100 ms.

Figure 16:
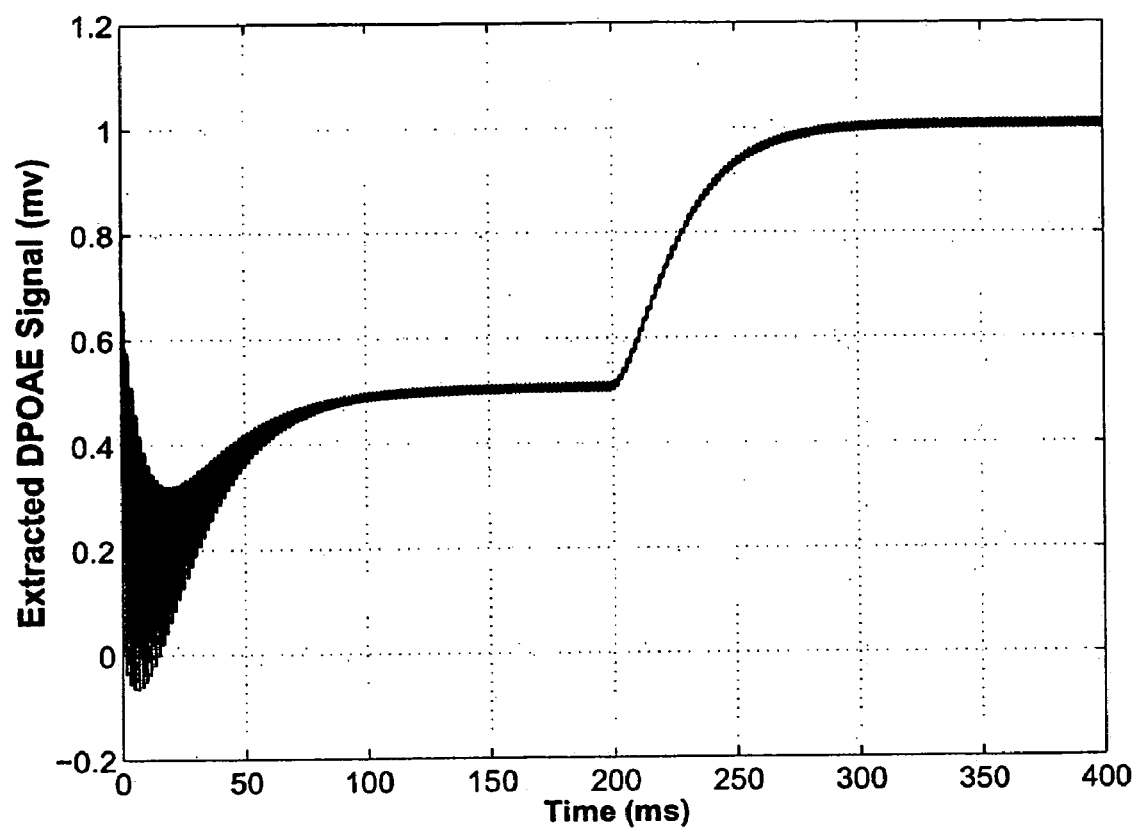
FIG. 16 illustrates, by way of example, performance of an audiometer configured according to one of the described embodiments for the extraction of DPOAE responsive to a step change.

To present the dynamic performance of the audiometer 1100, the response of the algorithm to a step change in the level of DPOAE signal is presented in FIG. 16. It is clear that the algorithm follows the variations in the level of DPOAE at a sufficiently high speed.

Figure 17:
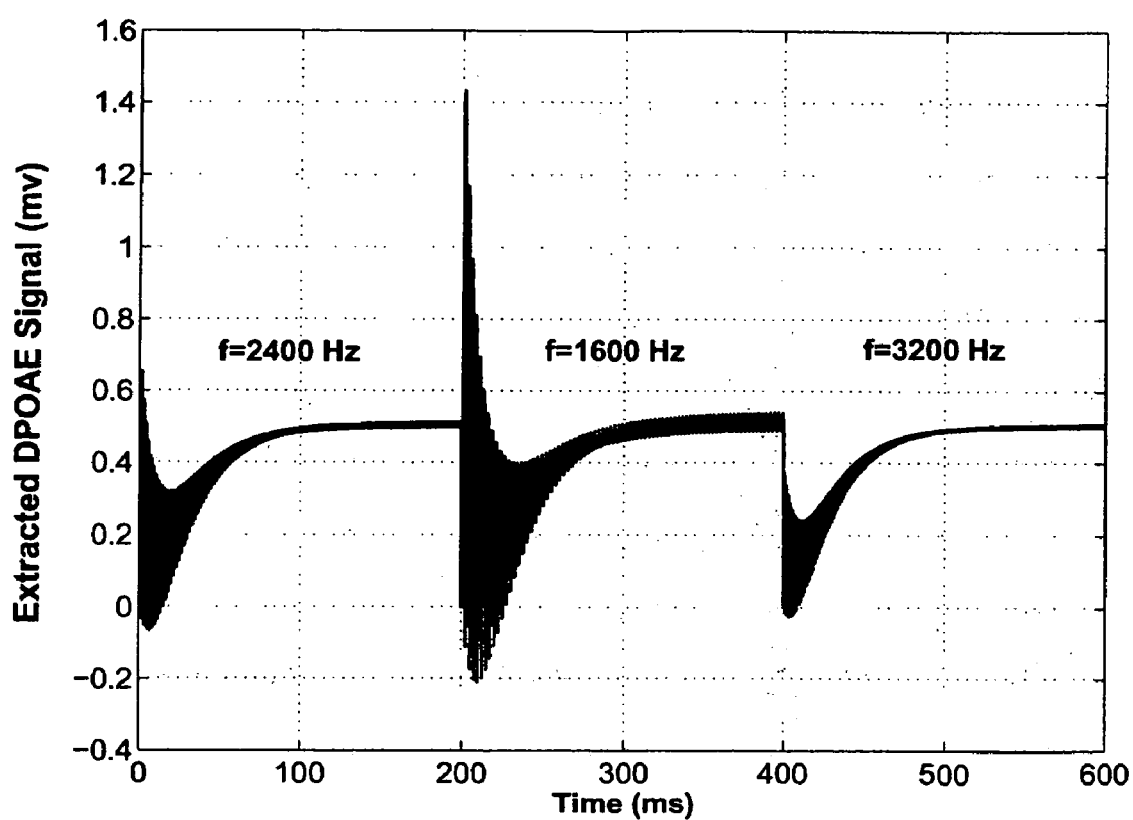
FIG. 17 illustrates, by way of example, performance of an audiometer configured according to one of the described embodiments for the extraction of DPOAE for multiple frequencies.

A number of measurements can be made consecutively FIG. 17 shows such an example In each case, the frequency of the extracted DPOAE signal is shown. As the frequency decreases, less number of cycles are available in a given time interval. For example, there are 160 cycles available in 100 ms of a signal of frequency f=1600 Hz whereas in the case of a signal of frequency f=4000 Hz the available number of cycles are 400 in the same time interval. This explains why the estimation of DPOAE level is better achieved at higher frequencies. It should be noted that within the range of frequencies of interest for DPOAEs, the algorithm provides acceptable estimates in about 100–200 ms.

Figure 18A:
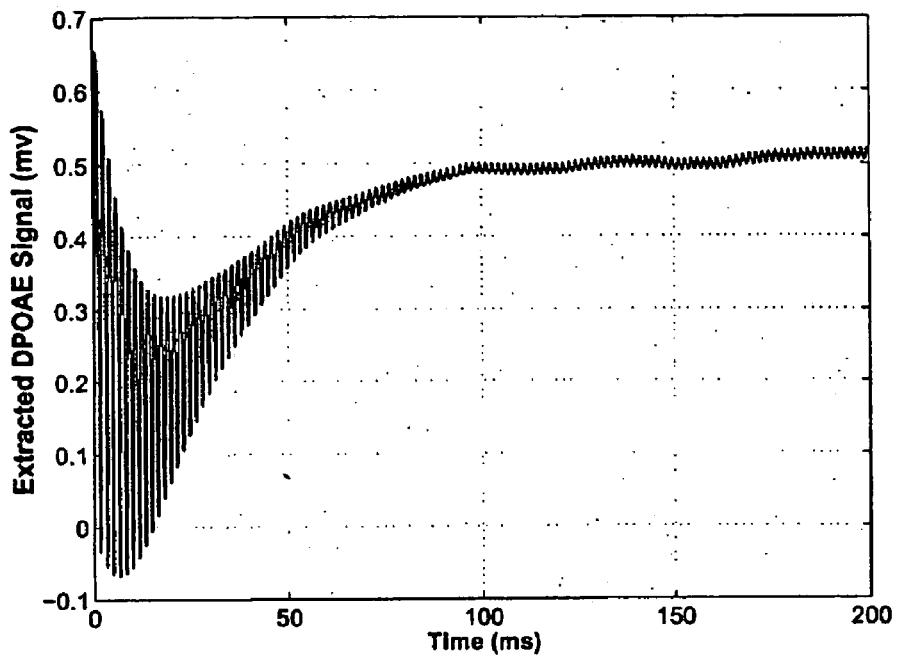
Figure 18B:
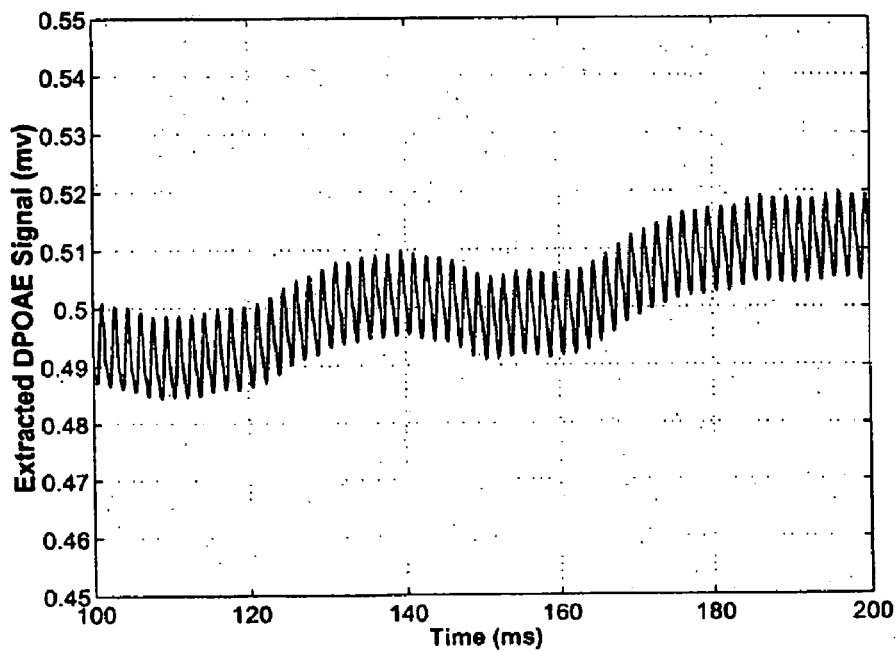
Figure 19A:
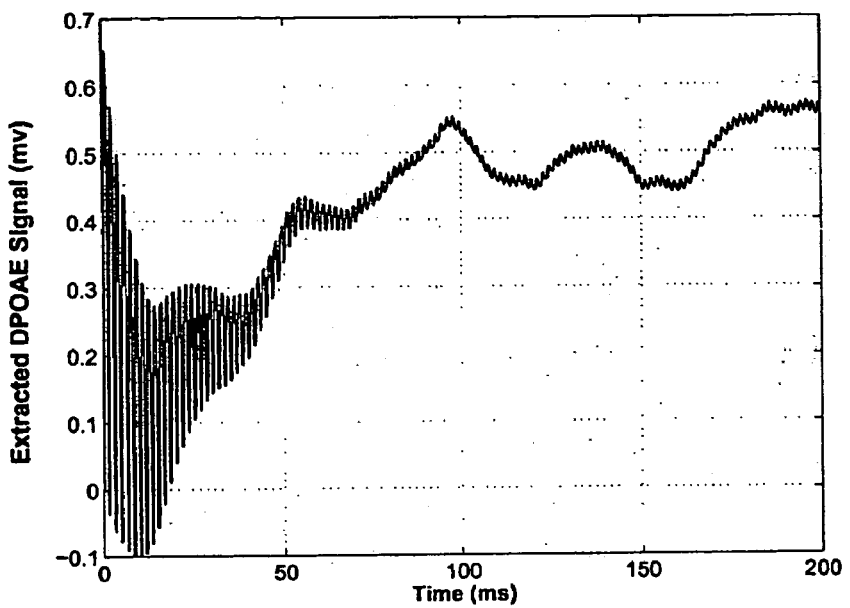
Figure 19B:
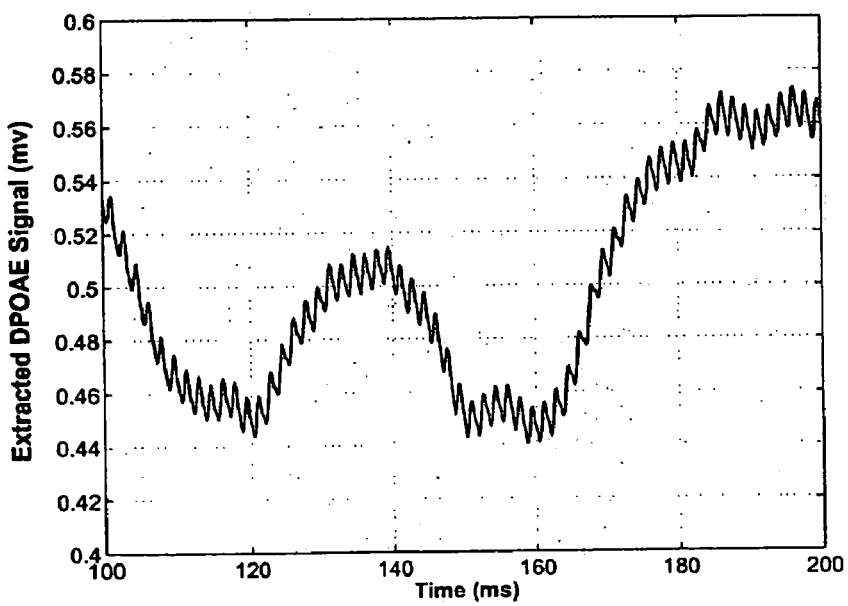

As noted before, one of the main features of the employed core algorithms is their noise immunity. Therefore, one expects that the overall DPOAE estimation scheme be immune to background noise. Usually, otoacoustic tests are conducted in quiet examination rooms so that the level of noise floor is low enough for good results. Under such controlled conditions, a noise floor of about 10 dB lower than DPOAE signal (SNR=10 dB) exists. It is obvious that an algorithm which is able to extract a DPOAE signal highly immersed in background noise is desirable in that it alleviates the need for special quiet examination facilities such as soundproof booths. FIGS. 18a and 18b show the performance of the audiometer 1100 in a highly noisy environment where the level of the DPOAE signal is set to be at the level of the noise floor (SNR=0 dB). The incurred error is negligible In FIGS. 19a and 19b, the level of noise is elevated to be 10 times larger than that of DPOAE signal itself. The incurred estimation error is less than ±15% which for most practical application is sufficiently good. The excellent noise immunity of the audiometer 1100 not only obviates the need for sound-proof examination rooms, but also provides the way to reduce the level of the artifacts for more patient friendly tests.

The invention has been described in terms of several preferred embodiments and examples. One of skill in the art will appreciate that the invention may be otherwise embodied without departing from its fair scope, which is set forth in the subjoined claims.

What is claimed is:

1. A method of extraction of at least one sinusoidal component of an input signal, comprising the steps of
   estimation of the amplitude of said sinusoidal component of said input signal;
   estimation of the frequency of said sinusoidal component of said input signal;
   estimation of the total phase of said sinusoidal component of said input signal;
   synthesization of said sinusoidal component of said input signal; and
   estimation of an error signal representing the difference between said input signal and said sinusoidal component of said input signal by the use of a first subtraction, wherein:
   the sinusoidal component of the input signal is the desired component of the input signal to which convergence is sought and specification of which is accomplished by predetermination of its frequency, and
   the error signal is the totality of the undesired components present in said input signal.

2. A method of extraction of sinusoids as defined in claim 1 wherein the step of estimation of the amplitude comprises a first integration of a first product of the error signal and a sine, or a cosine, of the total phase of the sinusoidal component of the input signal, scaled by a first scaling factor,
   wherein:
   the value of the initial condition of the first integration is a real number; and
   the first scaling factor is a positive number.

3. A method of extraction of sinusoids as defined in claim 2 wherein the step of estimation of the amplitude further comprises refining of the estimated value of the amplitude of the sinusoidal component of the input signal by using a first low pass filtering within the first integration.

4. A method of extraction of sinusoids as defined in claim 1 wherein the step of estimation of frequency comprises a second integration of a second product of the error signal, the amplitude of the sinusoidal component of the input signal, and a cosine, or a sine, of the total phase of the sinusoidal component of the input signal, scaled by a second scaling factor,
   wherein:
   the value of the initial condition of the second integration is a positive number; and
   the second scaling factor is a positive number.

5. A method of extraction of sinusoids as defined in claim 4 wherein the step of estimation of the frequency further comprises refining of the estimated value of the frequency of the sinusoidal component of the input signal by using a second low pass filtering within the second integration.

6. A method of extraction of sinusoids as defined in claim 4 wherein the second product is the product of the error signal and a cosine, or a sine, of the total phase of the sinusoidal component of the input signal.

7. A method of extraction of sinusoids as defined in claim 1 wherein the step of estimation of the total phase comprises a third integration of a summation of frequency of the sinusoidal component of the input signal and scaled by a third scaling factor of the time-derivative of the frequency of the sinusoidal component of the input signal,
   wherein:
   the value of the initial condition of the third integration is a real number, and the third scaling factor is a positive number, or zero.

8. A method of extraction of sinusoids as defined in claim 1 wherein the step of synthesization of the sinusoidal component of the input signal comprises a third product of the sine, or the cosine, of the total phase of the sinusoidal component of the input signal and the amplitude of the sinusoidal component of the input signal.

9. The method of extraction of sinusoids as defined in claim 1 further comprising the steps of:
   filtering the input signal to generate a filtered input signal;
   correcting amplitude and phase of the sinusoidal component based upon the sinusoidal component of the filtered input signal.

10. The method of extraction of sinusoids as defined in claim 1, further comprising:
    extracting a plurality of sinusoidal components from the input signal.

11. A method of elimination of at least one sinusoidal component of an input signal comprising the steps of extraction of the sinusoidal component of the input signal according to the method defined in claim 1; and
    subtraction of the sinusoidal component of the input signal from the input signal by the use of a second subtraction.

12. The method of claim 11 further comprising:
    extracting a sinusoidal component from the artifact-free input signal.

13. A system for the extraction of at least one sinusoidal component of an input signal, comprising:
    (a) estimation means for estimation of the amplitude of the sinusoidal component of the input signal by a first integration of a first product of an error signal and a sine, or a cosine, of the total phase of the sinusoidal component of the input signal, scaled by a first scaling factor,
    (b) estimation means for estimation of the frequency of the sinusoidal component of the input signal by a second integration of a second product of the error signal, the amplitude of the sinusoidal component of the input signal, and a cosine, or a sine, of the total phase of the sinusoidal component of the input signal, scaled by a second scaling factor;
    (c) estimation means for estimation of the total phase of the sinusoidal component of the input signal by a third integration of a summation of the frequency of the sinusoidal component of the input signal and scaled by a third scaling factor of time-derivative of the frequency of the sinusoidal component of the input signal;

(d) means for synthesization of the sinusoidal component of the input signal by a third product of the sine, or the cosine, of the total phase of the sinusoidal component of the input signal and the amplitude of the sinusoidal component of the input signal; and (e) estimation means for estimation of the error signal representing the difference between the input signal and the sinusoidal component of the input signal by a first subtraction.

14. A system for the extraction of sinusoids as defined in claim 13 wherein the means for estimation of amplitude is operable for refining the estimated value of the amplitude of the sinusoidal component of the input signal by a first low pass filter incorporated within the first integration.

15. A system for the extraction of sinusoids as defined in claim 13 wherein the means for estimation of the frequency is operable for refining the estimated value of the frequency of the sinusoidal component of the input signal by a second low pass filter incorporated within the second integration.

16. A system for the extraction of sinusoids as defined in claim 13 wherein the means for estimation of the frequency is operable for refining the estimated value of the frequency of the sinusoidal component of the input signal by a second low pass filter incorporated within the second integration.

17. A system for the extraction of sinusoids as defined in claim 13 further comprising:
means for correcting the amplitude and phase of the sinusoidal component of the filtered input signal based upon the frequency of the sinusoidal component of the filtered input signal.

18. A system of extraction of sinusoids as defined in claim 13 wherein the second product is the product of the error signal and a cosine, or a sine, of the total phase of the sinusoidal component of the input signal.

19. A system of extraction of sinusoids as defined in claim 13 wherein at least one of the first or second subtraction, the first, second or third integration, the first, second or third product, the first, second or third scaling, the summation, the sine or the cosine operations is implemented as analog circuitry.

20. A system of extraction of sinusoids as defined in claim 13 wherein at least one of the first or second subtraction, the first, second or third integration, the first, second or third product, the first, second or third scaling, the summation, the sine or the cosine operations is implemented as digital circuitry.

21. A system for the extraction of sinusoids as defined in claim 13 wherein at least one of the first or second subtraction, the first, second or third integration, the first, second or third product, the first, second or third scaling, the summation, the sine or the cosine operations is implemented as a software program.

22. A system for the extraction of sinusoids as defined in claim 13 further comprising:
means for subtraction of the sinusoidal component of the input signal from the input signal.

23. A system of extraction of sinusoids as defined in claim 13 further comprising:
means for generating an artifact-free input signal.

24. A system of extraction of as defined in claim 13 further comprising:
means for the multiple extraction of sinusoidal components of the input signal.

25. An audiometer comprising:
a probe operable to detect a signal responsive to a stimulus signal communicated to a testing subject;
a signal processing unit coupled to the probe for receiving the signal, the signal processor programmed to:
estimate the amplitude of said sinusoidal component of said received signal;
estimate the frequency of said sinusoidal component of said received signal;
estimate the total phase of said sinusoidal component of said received signal;
synthesize said sinusoidal component of said received signal; and
estimate an error signal representing the difference between said received signal and said sinusoidal component of said received signal by the use of a first subtraction, wherein:
the sinusoidal component of the received signal is the desired component of the received signal to which convergence is sought and specification of which is accomplished by predetermination of its frequency, and
the error signal is the totality of the undesired components present in said received signal.

26. The audiometer of claim 25, wherein the received signal comprises a steady-state evoked response signal.

27. The audiometer of claim 25, wherein the received signal comprises a transient evoked response signal.

28. The audiometer of claim 25, wherein the received signal comprises a distortion product otoacoustic emission.

29. The audiometer of claim 25, wherein the probe comprises a transducer for communicating the stimulus signal to the testing subject and a receiver for detecting the response signal.

30. The audiometer of claim 29, wherein the transducer comprises a speaker.

31. The audiometer of claim 29, wherein the receiver comprises a microphone.

32. The audiometer of claim 29, wherein the receiver comprises an electrode.

33. The audiometer of claim 25, further comprising a data acquisition unit coupled between the probe and the signal processing unit, the data acquisition unit adapted to condition at least one of the stimulus signal and the response signal.

34. The audiometer of claim 33, wherein the data acquisition unit comprises a filter coupled between the probe and the signal processing unit.

35. The audiometer of claim 25, wherein the signal processor comprises a plurality of core units, each of the plurality of core units arranged to extract a corresponding sinusoidal component.

36. The audiometer of claim 25, wherein the signal processor comprises a first core unit arranged to extract a sinusoidal component associated with an artifact signal and a second core unit arranged to extract a sinusoidal component associated with the response signal.

37. The audiometer of claim 36, wherein the signal processor wherein the second core unit is operable on difference of the sinusoidal component associated with an artifact signal and the received signal.

38. The audiometer of claim 25, wherein the signal processing unit is implemented in analog circuitry.

39. The audiometer of claim 25, wherein the signal processing unit is implemented in digital circuitry.

40. The audiometer of claim 25, wherein the signal processing unit is implemented in software.

* * * * *

UNITED STATES PATENT AND TRADEMARK OFFICE
CERTIFICATE OF CORRECTION

PATENT NO. : 7,003,413 B2 Page 1 of 1
APPLICATION NO. : 10/698801
DATED : February 21, 2006
INVENTOR(S) : Alireza K. Ziarani It is certified that error appears in the above-identified patent and that said Letters Patent is hereby corrected as shown below:

In the Claims:

Column 8, line 2, "of the frequency" should be -- of frequency --,

Column 19, line 60, "of as" should be -- of sinusoids as --.

Signed and Sealed this

Nineteenth Day of December, 2006

JON W. DUDAS
*Director of the United States Patent and Trademark Office*